(12) United States Patent
Matsuda et al.

(10) Patent No.: US 7,183,168 B2
(45) Date of Patent: Feb. 27, 2007

(54) METHOD OF MANUFACTURING A SEMICONDUCTOR DEVICE HAVING A SILICIDE FILM

(75) Inventors: Satoshi Matsuda, Yokohama (JP); Kazuya Ohuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 11/001,334

(22) Filed: Dec. 2, 2004

(65) Prior Publication Data

US 2005/0106801 A1 May 19, 2005

Related U.S. Application Data

(60) Continuation of application No. 10/716,142, filed on Nov. 19, 2003, now Pat. No. 6,841,429, which is a division of application No. 10/241,488, filed on Sep. 12, 2002, now Pat. No. 6,677,660.

(30) Foreign Application Priority Data

Aug. 12, 2002 (JP) .............................. 2002-235073

(51) Int. Cl.
H01L 21/336 (2006.01)
H01L 21/3205 (2006.01)
H01L 21/4763 (2006.01)

(52) U.S. Cl. .............. 438/302; 438/585; 438/592; 257/E21.092; 257/E21.623; 257/E21.637

(58) Field of Classification Search .......... 438/302, 438/585, 592, 682, 303, 307, 299, 306, 199, 438/153; 257/E21.092, E21.623, E21.637
See application file for complete search history.

(56) References Cited

U.S. PATENT DOCUMENTS 6,127,707 A 10/2000 Chong et al.

| 6,255,149 | B1 | 7/2001 | Bensahel et al. |
| 6,342,421 | B1* | 1/2002 | Mitani et al. ............... 438/300 |
| 6,346,447 | B1* | 2/2002 | Rodder ....................... 438/300 |
| 6,518,155 | B1 | 2/2003 | Chau et al. |
| 6,524,902 | B2 | 2/2003 | Rhee et al. |
| 6,573,583 | B2 | 6/2003 | Hokazono |
| 6,610,576 | B2* | 8/2003 | Nowak ........................ 438/301 |
| 6,696,328 | B2* | 2/2004 | Rhee et al. ................. 438/199 |
| 6,713,359 | B1 | 3/2004 | Mizushima et al. |

(Continued)

FOREIGN PATENT DOCUMENTS

JP 411274320 A 10/1999

(Continued)

OTHER PUBLICATIONS

Yasuhiro Sato, et al., "Study of HF-Treated Heavily-Doped Si Surface Using Contact Angel Measurements", JPN, J. Appl. Phys., vol. 33, Dec. 1994, pp. 6508-6513.

(Continued)

Primary Examiner—Walter Lindsay, Jr.
(74) Attorney, Agent, or Firm—Oblon, Spivak, McClelland, Maier & Neustadt, P.C.

(57) ABSTRACT

A method of manufacturing a semiconductor device includes implanting germanium ions into a selected portion of a semiconductor region containing at least silicon, forming P-type and N-type diffusion layers in the semiconductor region, and forming a suicide film which extends from the N type diffusion layer over to the boundary region and the P-type diffusion layer. A boundary region between the P-type and N-type diffusion layers is formed in the selected portion.

12 Claims, 27 Drawing Sheets

U.S. PATENT DOCUMENTS

| | | | |
|---|---|---|---|
| 6,746,943 B2 | 6/2004 | Takayanagi et al. | |
| 6,767,798 B2 | 7/2004 | Kalnitsky et al. | |
| 6,784,062 B2 * | 8/2004 | Cho et al. | 438/302 |
| 2003/0207555 A1 | 11/2003 | Takayanagi et al. | |
| 2006/0088968 A1 * | 4/2006 | Shin et al. | 438/299 |
| 2006/0160315 A1 * | 7/2006 | Suguro et al. | 438/299 |

FOREIGN PATENT DOCUMENTS

| | | |
|---|---|---|
| JP | 2002-110817 | 4/2002 |

OTHER PUBLICATIONS

Toshihiko Kosugi, et al, "Effects of Hydrogenation of Hydrogen Termination of p+-silicon (100) Surface by Hydrofluoric Acid", J. Vac. Sci. Technol. A15(1), Jan./Feb. 1997, pp. 127-132.

Yoshihiro Sugita, et al., "Influence of Microscopic Chemical Reactions on the Preparation of an Oxide-Free Silicon Surface in a Fluorine-Based Solution", JPN. J. Appl. Phys., vol. 38, 1999, pp. 2427-2433.

* cited by examiner

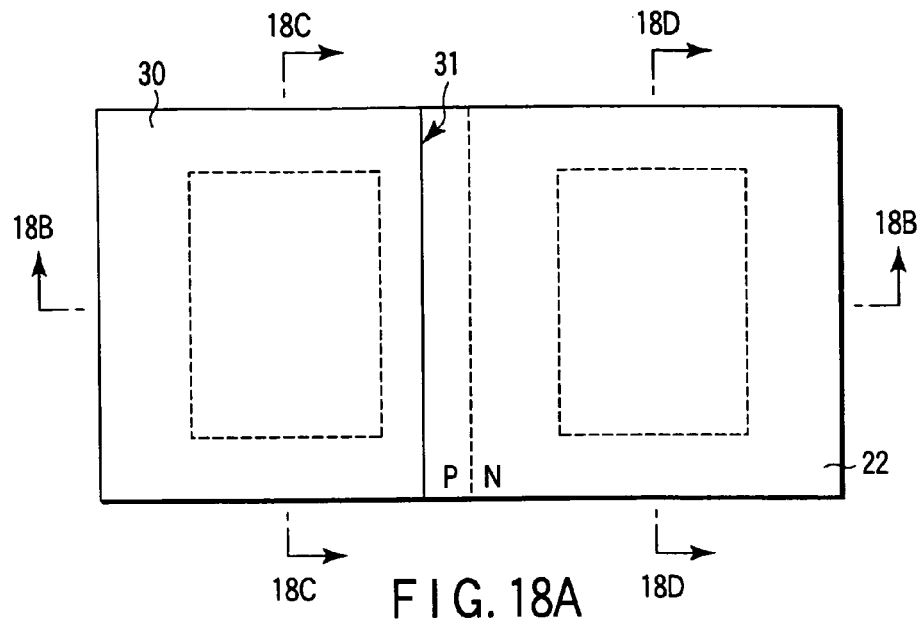
FIG. 18A
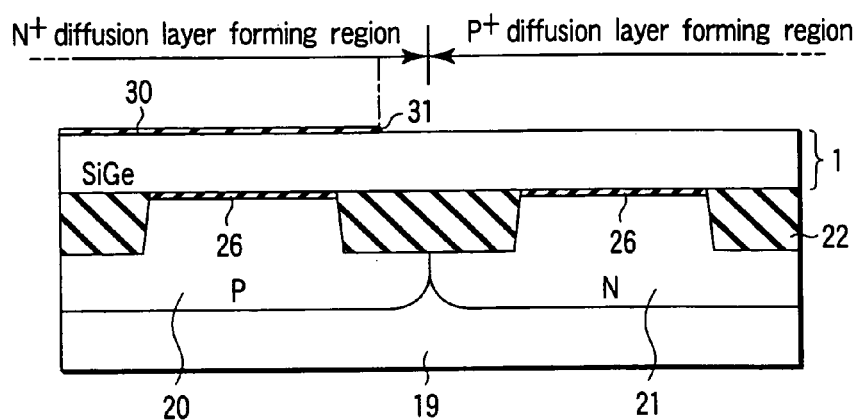
FIG. 18B
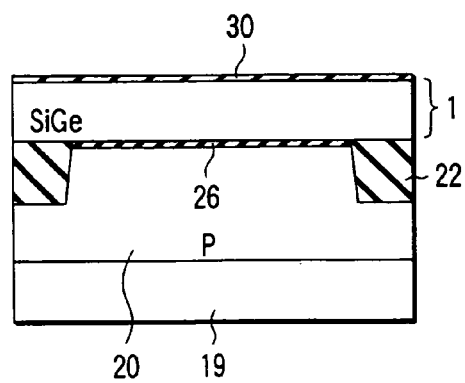 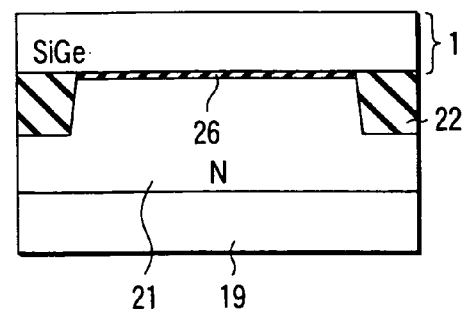
FIG. 18C  FIG. 18D

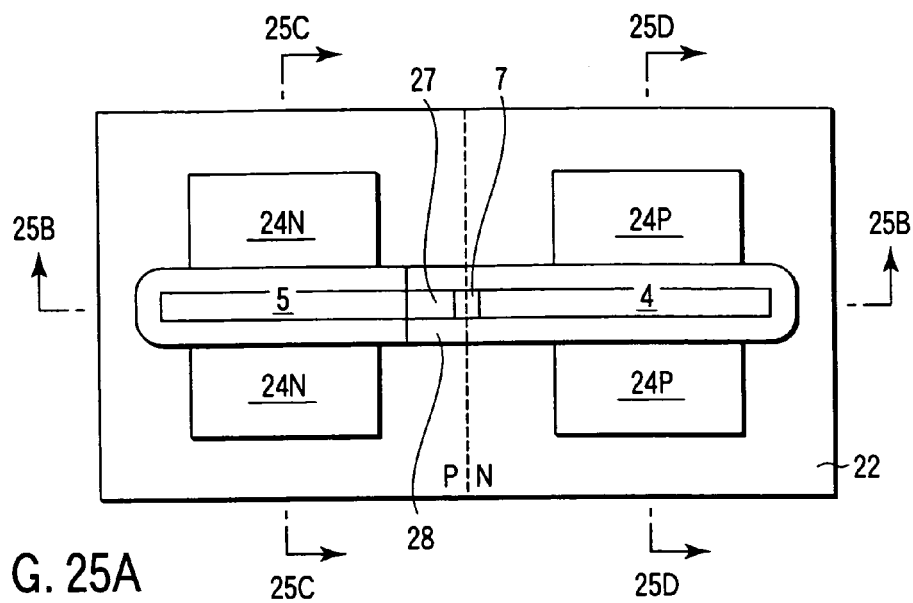
FIG. 25A
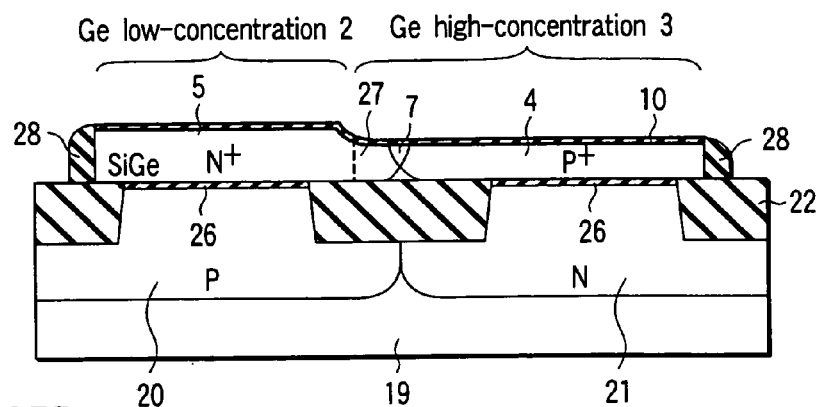
FIG. 25B
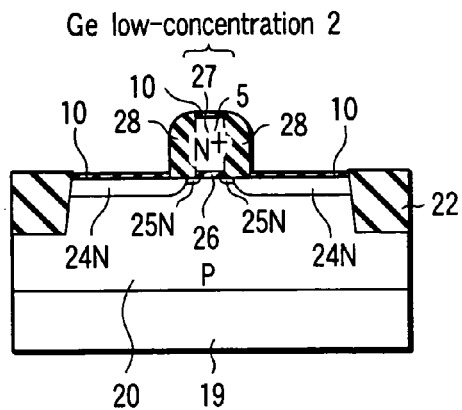 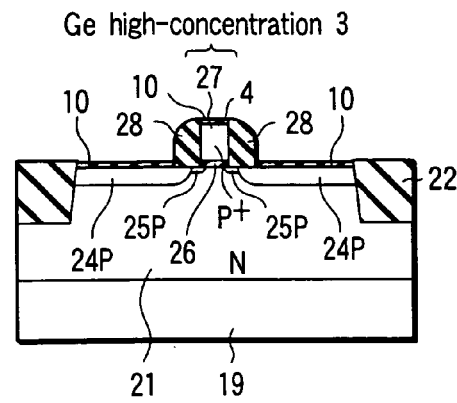
FIG. 25C   FIG. 25D

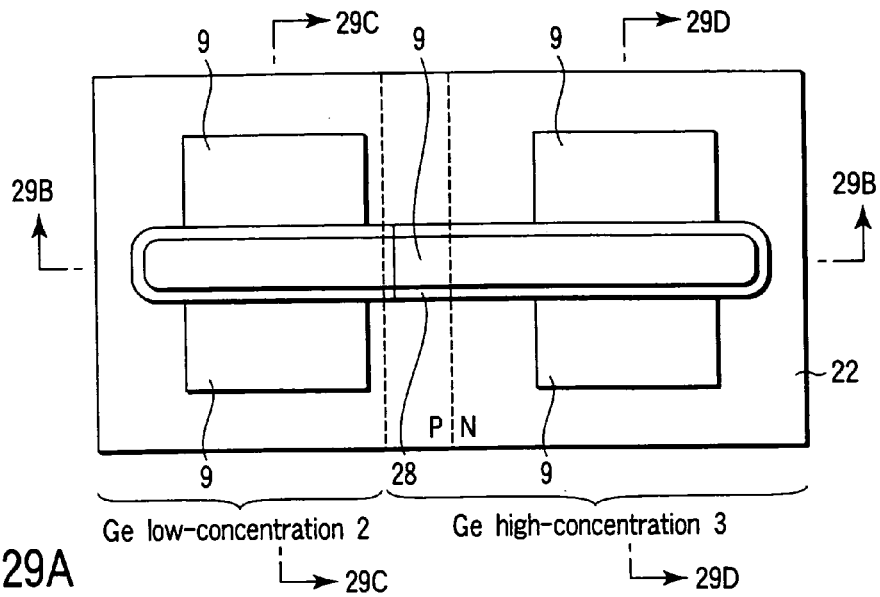
FIG. 29A
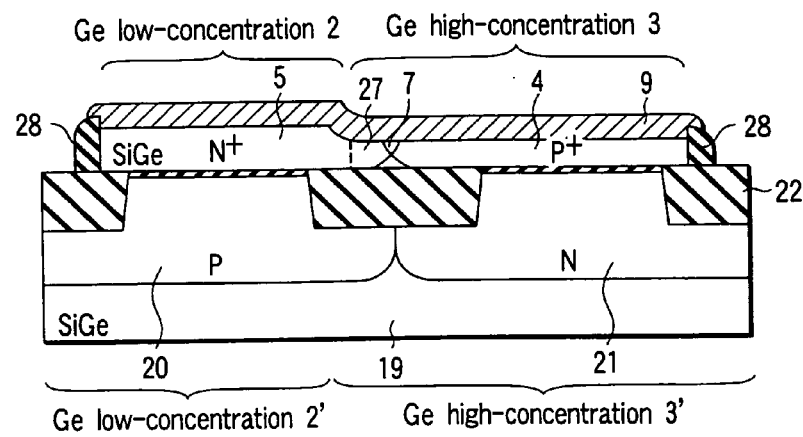
FIG. 29B
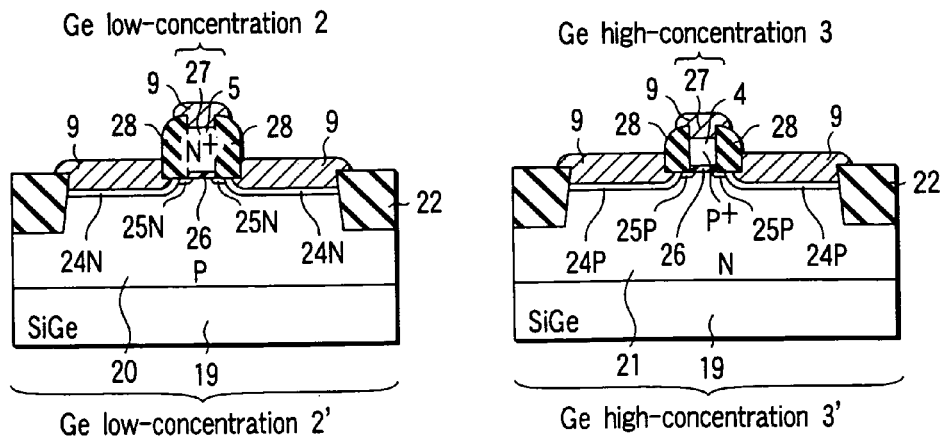
FIG. 29C
FIG. 29D

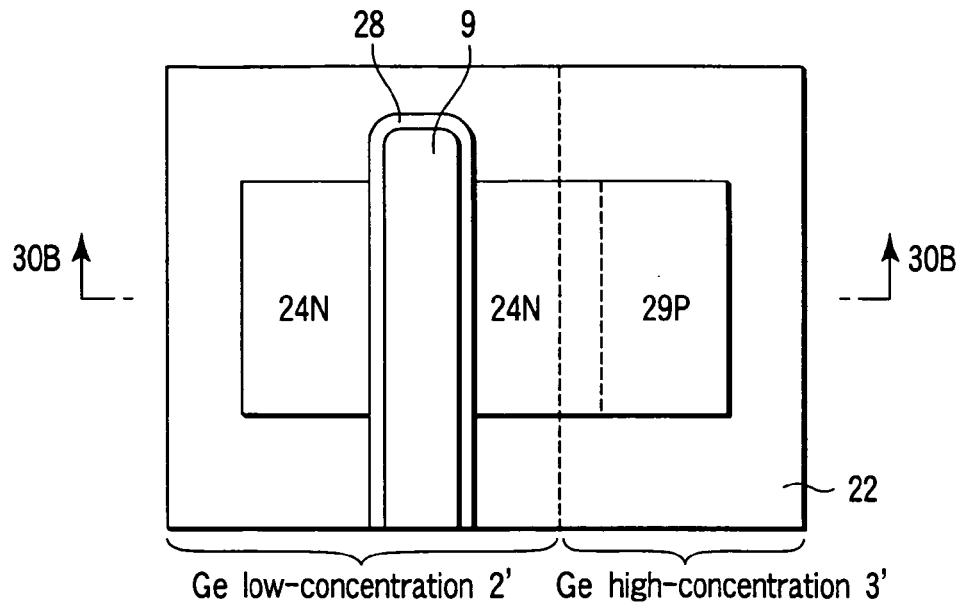
F I G. 30A
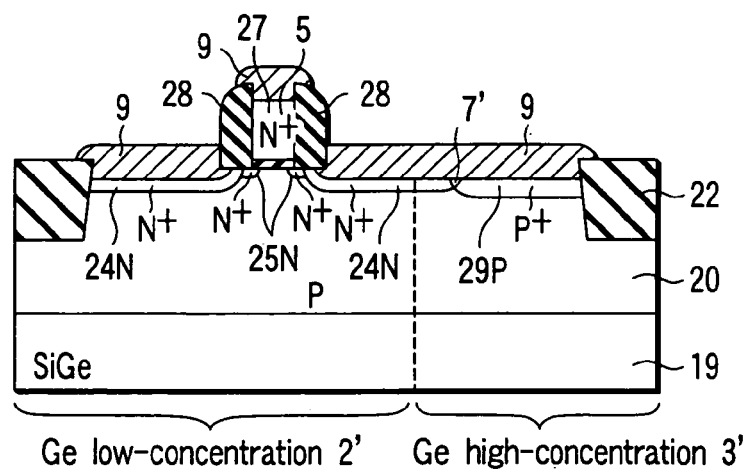
F I G. 30B

METHOD OF MANUFACTURING A SEMICONDUCTOR DEVICE HAVING A SILICIDE FILM

CROSS-REFERENCE TO RELATED APPLICATIONS

This application is based upon and claims the benefit of priority from the prior Japanese Patent Application No. 2002-235073, filed Aug. 12, 2002, the entire contents of which are incorporated herein by reference.

This application is a Continuation application of U.S. Ser. No. 10/716,142, now filed Nov. 19, 2003, now U.S. Pat. No. 6,841,429, allowed, which is a Divisional application of Ser. No. 10/241,488 filed Sep. 12, 2002, now U.S. Pat. No. 6,677,660.

BACKGROUND OF THE INVENTION

1. Field of the Invention

This invention relates to a semiconductor device and a method of manufacturing the same and more particularly to a semiconductor device having a silicide film and a method of manufacturing the same.

2. Description of the Related Art

As the performance of a MOS transistor is more enhanced, it becomes more popular to form the gate electrode in a silicide form in order to reduce the parasitic resistive component thereof. For an integrated circuit such as an SRAM which requires extremely high integration density, a transistor structure in which the gates of an NMOS transistor and a PMOS transistor are used as one Si gate pattern and a junction portion between an N+ diffusion layer and P+ diffusion layer in the Si gate pattern is short-circuited by use of a silicide film is formed.

In a case where the N+ diffusion layer and P+ diffusion layer are thus formed in the same Si gate pattern, normally, the Si gate pattern is formed with a resist mask and N-type and P-type impurities are selectively ion-implanted. At this time, the N+ diffusion layer and P+ diffusion layer may be superposed depending on the alignment position of the resist mask and an impurity mixture region in which N-type and P-type impurities exist in a mixed form may be formed in the Si gate pattern in some cases. The thickness of a natural oxide film formed on the surface of the impurity mixture region is different from the thickness of a natural oxide film formed on the surface of the N+ diffusion layer and the thickness of a natural oxide film formed on the surface of the P+ diffusion layer.

Further, it is known that the natural oxide film formed on the surface of the P+ diffusion layer is more difficult to remove than the natural oxide film formed on the surface of the N+ diffusion layer. More specifically, since the concentration of holes in the natural oxide film or oxide film formed on the surface of the P+ diffusion layer becomes higher, it is difficult to completely remove the oxide film.

Reference document: Sato et al. "Study of HF-Treated Heavily-Doped Si Surface Using Contact Angle Measurements" Jpn. J. Appl. Phys. Vol. 33 (1994), pp 6508 to 6513.

When a silicide film is formed on the surface of the Si gate pattern, a step of removing the natural oxide film from the surface of the Si gate pattern is provided as the preprocessing step. However, if the thickness of the natural oxide film formed on the surface of the Si gate pattern varies and the difficulty in removing the natural oxide film varies, the natural oxide film cannot be completely removed in the preprocessing step and may be partly left behind on the surface of the Si gate pattern in some cases. The thus remaining region of the natural oxide film will obstruct the silicidation reaction between Si and metal. As a result, the resistance may increase in the remaining region of the natural oxide film in the Si gate pattern and an "open" defect may occur. Next, an example of the problem is explained.

FIGS. 33A to 33E are cross sectional views showing a manufacturing method of the conventional semiconductor device in the order of the manufacturing steps and particularly showing a case wherein an impurity mixture region is formed in the Si gate pattern.

First, as shown in FIG. 33A, a P+ diffusion layer 104, N+ diffusion layer 105 and N+/P+ mixed layer 107 are formed in an Si gate pattern 101. Further, a natural oxide film 110 is formed on the surface of the Si gate pattern 101 and, particularly, the film thickness t107 of the natural oxide film formed on the surface of the impurity mixture region 107 is different from the film thickness t104 of the natural oxide film formed on the surface of the P+ diffusion layer 104 and the film thickness t105 of the natural oxide film formed on the surface of the N+ diffusion layer. Specifically, the film thickness t107 is larger than the film thickness t104 and the film thickness t107.

Next, as shown in FIG. 33B, the natural oxide film 110 is etched by a wet etching process using hydrofluoric acid or the like. At this time, it is assumed that the natural oxide film 110 is partly left behind on the surface of the impurity mixture region 107.

Then, as shown in FIG. 33C, a metal film 111 is formed on the Si gate pattern 101 with the natural oxide film 110 partly left behind thereon.

After this, as shown in FIG. 33D, the heat treatment is performed to cause a reaction between the Si gate pattern 101 and the metal film 111 so as to form a silicide film 109. At this time, since the reaction is difficult to occur on the natural oxide film 110, the silicide film 109 is not practically formed on the natural oxide film 110.

Next, as shown in FIG. 33E, a non-reacted portion of the metal film 111 is removed. Thus, the Si gate pattern 101 whose surface is formed in a silicide form can be obtained.

However, since the silicide film 109 is not practically formed on the impurity mixture region 107, the silicide film 109 is divided on a boundary portion 106 between the P+ diffusion layer 104 and the N+ diffusion layer 105. As a result, a junction portion between the P+ diffusion layer 104 and the N+ diffusion layer 105 cannot be short-circuited by use of the silicide film 109. For example, this may be a cause of the "open" defect.

FIGS. 34A to 34E are cross sectional views showing another manufacturing method of the conventional semiconductor device in the order of the manufacturing steps and particularly showing a case wherein a natural oxide film is left behind on the surface of a P+ diffusion layer.

First, as shown in FIG. 34A, a P+ diffusion layer 104 and N+ diffusion layer 105 are formed in an Si gate pattern 101 and a natural oxide film 110 is formed on the surface of the Si gate pattern 101.

Next, as shown in FIG. 34B, the natural oxide film 110 is etched by a wet etching process using hydrofluoric acid or the like. At this time, it is assumed that the natural oxide film 110 is partly left behind on the surface of the P+ diffusion layer 104.

Then, as shown in FIG. 34C, a metal film 111 is formed on the Si gate pattern 101 with the natural oxide film 110 partly left behind thereon.

After this, as shown in FIG. 34D, the heat treatment is performed to cause a reaction between the Si gate pattern 101 and the metal film 111 so as to form a silicide film 109. At this time, as explained with reference to FIG. 33D, the silicide film 109 is not practically formed on the natural oxide film 110.

Next, as shown in FIG. 34E, a non-reacted portion of the metal film 111 is removed. Thus, the Si gate pattern 101 whose surface is formed in a silicide form can be obtained.

However, since the silicide film 109 is not practically formed on the natural oxide film 110, the silicide film 109 is divided on the P+ diffusion layer 104. As a result, the resistance will increase on a region of the P+ diffusion layer 104 on which the natural oxide film 110 is left behind.

The problems caused by leaving behind the natural oxide film 10 on the Si gate pattern 101 can be solved by increasing an etching amount of the natural oxide film 110 in the steps shown in FIGS. 33B and 34B, for example. However, if an etching amount of the natural oxide film 110 is increased, excessive etching will occur in a portion of the integrated circuit, for example, in the element isolation region. Next, a typical example of a problem caused by the excessive etching is explained below.

FIGS. 35 to 39 are cross sectional views showing a manufacturing method of the conventional semiconductor device in the order of the manufacturing steps and particularly showing a salicide process.

First, as shown in FIG. 35, an element isolation region 122 is formed on the surface region of an N-type well region 121 to define an element region 123. In the element region 123, P+ diffusion layers 124 and P− diffusion layers 125 which act as the source/drain regions of an MOSFET are formed. The P− diffusion layer 125 is a region called an LDD (Lightly Doped Drain) region or extension region in the MOSFET with the LDD structure. A gate insulating film 126 is formed on a channel region between the P− diffusion layers 125 and a gate electrode 127 is formed on the gate insulating film 126. The gate electrode 127 is formed of silicon having P-type impurity doped therein and, for example, corresponds to the P+ diffusion layer 104 of the Si gate pattern 101 shown in FIGS. 33A and 34A. A side wall insulating film 128 is formed on the side walls of the gate electrode 127 and on the P− diffusion layers 125. The side wall insulating film 128 is a silicon oxide film. A natural oxide film 110 is formed on the surfaces of the P+ diffusion layers 124 and on the surface of the gate electrode 127.

Next, as shown in FIG. 36, the natural oxide film 110 is etched by a wet etching process using hydrofluoric acid or the like. In the etching process, it is assumed that an etching amount of the natural oxide film 110 is increased to completely remove the natural oxide film.110 from the surface of the gate electrode 127 and the surfaces of the P+ diffusion layers 124. At this time, excessive etching occurs in the element isolation region 122 and side wall insulating film 128 to reduce the film thicknesses thereof. In this case, if the film thickness of the element isolation region 122 is extremely reduced, the upper surface of the etched element isolation region 122 becomes lower than the junction between the P+ diffusion layer 124 and the N-type well region 121 as indicated by a reference symbol 130 so as to expose a portion of the N-type well region 121 in some cases.

Then, as shown in FIG. 37, a metal film 111 is formed on the structure in which the portion of the N-type well region 121 is exposed.

After this, as shown in FIG. 38, the heat treatment is performed to cause a reaction between Si of the gate electrode 127 and element region 123 and the metal film 111 so as to form a silicide film 109.

Next, as shown in FIG. 39, a non-reacted portion of the metal film 111 is removed. Thus, the surface of the gate electrode 127 and the surface of the P+ diffusion layer 124 are formed in a silicide form.

However, since the film thickness of the element isolation region 122 is reduced and the N-type well region 121 is partly exposed, the silicide film 109 is formed to extend over the P+ diffusion layer 124 and N-type well region 121. As a result, the P+ diffusion layer 124 and the N-type well region 121 are short-circuited via the silicide film 109. Then, a problem that a junction leak between the P+ diffusion layer 124 and the N-type well region 121 is increased or the MOSFET will not be operated will occur.

BRIEF SUMMARY OF THE INVENTION

A method of manufacturing a semiconductor device according to a first aspect of the present invention comprises implanting germanium ions into a selected portion of a semiconductor region containing at least silicon, forming P-type and N-type diffusion layers in the semiconductor region with a boundary region between the above diffusion layers being set in the selected portion, and forming a silicide film which extends from the N-type diffusion layer over to the boundary region and the P-type diffusion layer.

A method of manufacturing a semiconductor device according to a second aspect of the present invention comprises forming a germanium low-concentration region containing germanium of low concentration and a germanium high-concentration region containing germanium of high concentration in a semiconductor region containing at least silicon, forming P-type and N-type diffusion layers in the semiconductor region with a boundary region between the above diffusion layers being set in the germanium high-concentration region, and forming a silicide film which extends from the N-type diffusion layer over to the boundary region and the P-type diffusion layer.

A method of manufacturing a semiconductor device according to a second aspect of the present invention comprises implanting first germanium ions into a first selected portion of a semiconductor region containing at least silicon, implanting second germanium ions into a second selected portion of the semiconductor region, the dose amount of the second germanium ions being smaller than the dose amount of the first germanium ions, forming P-type and N-type diffusion layers in the semiconductor region with a boundary region between the above diffusion layers being set in the first selected portion, and forming a silicide film which extends from the N-type diffusion layer over to the boundary region and the P-type diffusion layer.

A method of manufacturing a semiconductor device according to a third aspect of the present invention comprises implanting germanium ions into a selected portion of a semiconductor region containing at least silicon and germanium, forming P-type and N-type diffusion layers in the semiconductor region with a boundary region between the above.

BRIEF DESCRIPTION OF THE SEVERAL VIEWS OF THE DRAWING

FIG. 18A is a plan view showing one manufacturing method of the semiconductor device according to the second embodiment of the present invention, FIG. 18B is a cross sectional view taken along the 18B—18B line of FIG. 18A, FIG. 18C is a cross sectional view taken along the 18C—18C line of FIG. 18A, and FIG. 18D is a cross sectional view taken along the 18D—18D line of FIG. 18A;

FIG. 25A is a plan view showing one manufacturing method of the semiconductor device according-to the second embodiment of the present invention, FIG. 25B is a cross sectional view taken along the 25B—25B line of FIG. 25A, FIG. 25C is a cross sectional view taken along the 25C—25C line of FIG. 25A, and FIG. 25D is a cross sectional view taken along the 25D—25D line of FIG. 25A;

FIG. 29A is a plan view showing a semiconductor device according to a third embodiment of the present invention, FIG. 29B is a cross sectional view taken along the 29B—29B line of FIG. 29A, FIG. 29C is a cross sectional view taken along the 29C—29C line of FIG. 29A, and FIG. 29D is a cross sectional view taken along the 29D—29D line of FIG. 29A;

FIG. 30A is a plan view showing the semiconductor device according to the third embodiment of the present invention, and FIG. 30B is a cross sectional view taken along the 30B—30B line of FIG. 30A;

DETAILED DESCRIPTION OF THE INVENTION

There will now be described embodiments of this invention with reference to the accompanying drawings. In the following explanation, common portions are denoted by the same reference symbols throughout the drawings.

First Embodiment

Figure 1A:
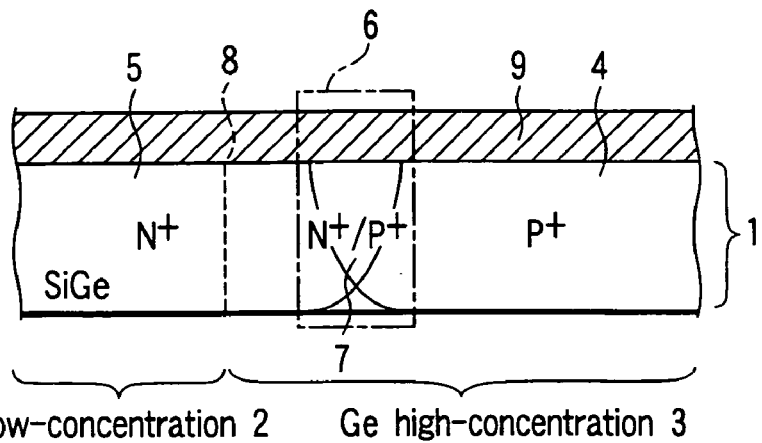
FIG. 1A is a cross sectional view showing a semiconductor device according to a first embodiment of the present invention.

FIG. 1A is a cross sectional view showing a semiconductor device according to a first embodiment of the present invention.

As shown in FIG. 1A, silicon (Si) and germanium (Ge) are contained in a semiconductor region, for example, in a semiconductor film 1. One example of the semiconductor film 1 is the gate pattern of a MOSFET. A Ge low-concentration region 2 in which germanium is contained with low concentration and a Ge high-concentration region 3 in which germanium is contained with high concentration are formed in the semiconductor film 1 in the present embodiment.

Further, in the semiconductor film 1, a P+ diffusion layer 4 and N+ diffusion layer 5 are formed. A boundary region 6 between the P+ diffusion layer 4 and the N+ diffusion layer 5 is formed in the Ge high-concentration region 3.

The boundary region 6 in the present embodiment contains an impurity mixture region (N+/P+) 7 containing N-type and P-type impurities. The P+ diffusion layer 4 is formed in the Ge high-concentration region 3. Further, a boundary 8 between the Ge low-concentration region 2 and the Ge high-concentration region 3 is formed in the N+ diffusion layer 5. A silicide film 9 is continuously formed on the N+ diffusion layer 5, boundary region 6 and P+ diffusion layer 4. The silicide film 9 is not divided on the P+ diffusion layer 4.

Next, one example of the manufacturing method of the semiconductor device according to the first embodiment is explained.

FIGS. 2 to 13 are cross sectional views showing the semiconductor device of the first embodiment according to one example of the manufacturing method thereof.

Figure 2:
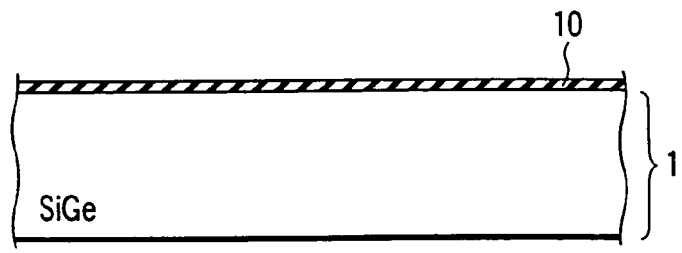
FIG. 2 is a cross sectional view showing one manufacturing step of the semiconductor device according to the first embodiment of the present invention.

First, as shown in FIG. 2, a semiconductor film 1 containing at least silicon is formed. In this example, the semiconductor film 1 is a gate pattern and formed on a gate insulating film (not shown). The film thickness of the semiconductor film 1 can be set to a desired value. If an example is daringly given, the film thickness is 100 nm to 200 nm in a case where the semiconductor film 1 is a gate pattern and in the generation in which the gate length of the transistor is 100 nm.

Further, germanium (Ge) is contained in the semiconductor film 1 of the present example in addition to silicon to form a polycrystalline SiGe film. A natural oxide film 10 is formed on the surface of the semiconductor film 1.

Figure 3:
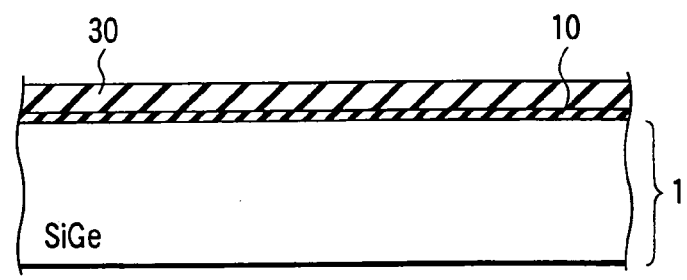
FIG. 3 is a cross sectional view showing one manufacturing step of the semiconductor device according to the first embodiment of the present invention.

Next, as shown in FIG. 3, an oxidation-resistant film 30 is formed on the semiconductor film 1 with the natural oxide film 10 formed thereon. One example of a material of the oxidation-resistant film 30 is silicon nitride. The film thickness of the oxidation-resistant film 30 can be set to film thickness which may suppress oxidation of the semiconductor film 1. For example, the film thickness is set to approximately 10 nm to 50 nm. If the film thickness is set to approximately 10 nm to 50 nm, the oxidation-resistant film 30 can be easily separated in the later step.

Figure 4:
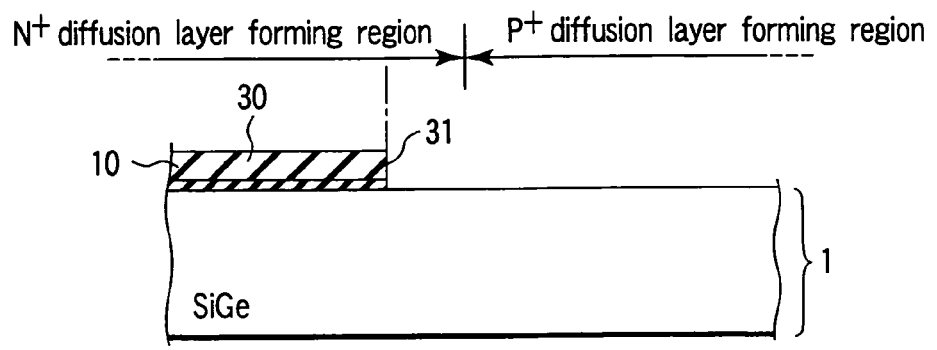
FIG. 4 is a cross sectional view showing one manufacturing step of the semiconductor device according to the first embodiment of the present invention.

Next, as shown in FIG. 4, the oxidation-resistant film 30 is patterned by a reactive ion etching (RIE) process using a resist mask, for example, so as to expose the surface of a portion of the semiconductor film 1 which corresponds to a P+ diffusion layer forming region. At this time, an end portion 31 of the oxidation-resistant film 30 is disposed inside an N+ diffusion layer forming region. The end portion 31 of the oxidation-resistant film 30 will define the boundary between the Ge low-concentration region and the Ge high-concentration region.

Figure 5:
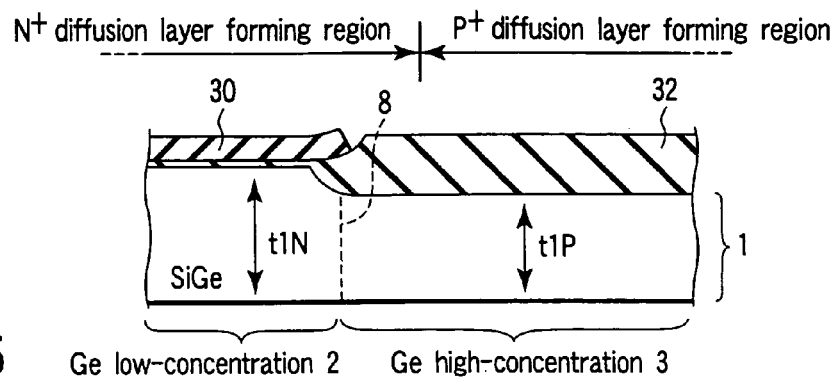
FIG. 5 is a cross sectional view showing one manufacturing step of the semiconductor device according to the first embodiment of the present invention.

After this, as shown in FIG. 5, the surface of the semiconductor film 1 is oxidized to form a silicon oxide film 32 with the oxidation-resistant film 30 used as a mask. By forming the silicon oxide film 32, the film thickness t1P of the semiconductor film 1 in the P+ diffusion layer forming region becomes smaller than the film thickness t1N thereof in the N+ diffusion layer forming region. At this time, the property that germanium is difficult to be introduced into the silicon oxide film 32 is utilized so that the Ge concentration in the thinned semiconductor film 1 can be increased. As a result, the region 2 in which the Ge concentration is low and the region 3 in which the Ge concentration is high are formed in the semiconductor film 1.

Figure 6:
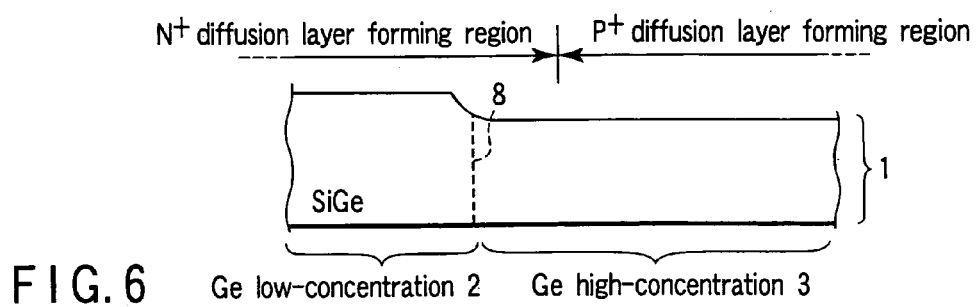
FIG. 6 is a cross sectional view showing one manufacturing step of the semiconductor device according to the first embodiment of the present invention.

Next, as shown in FIG. 6, the oxidation-resistant film 30 and silicon oxide film 32 are removed from the semiconductor film 1. At this time, the natural oxide film 10 is also removed as shown in FIG. 6. However, if the surface of the semiconductor film 1 is exposed to oxygen in the later step, a natural oxide film 10 is formed on the surface of the semiconductor film 1 again.

Figure 7:
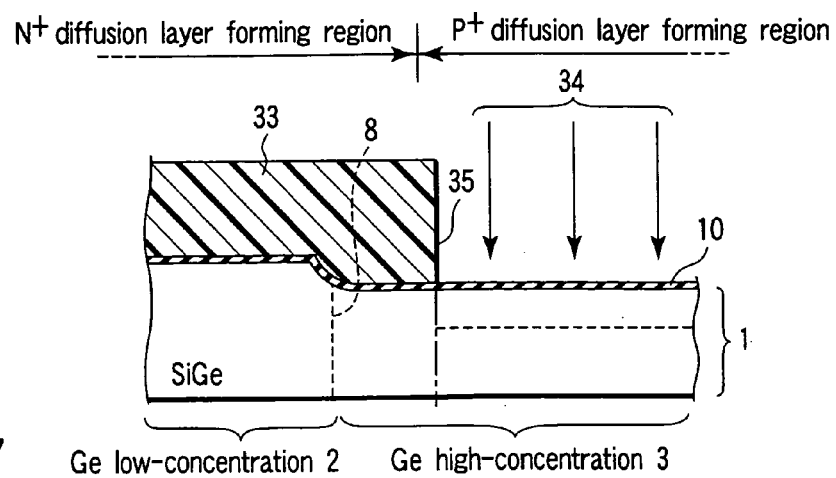
FIG. 7 is a cross sectional view showing one manufacturing step of the semiconductor device according to the first embodiment of the present invention.

After this, as shown in FIG. 7, after the semiconductor film 1 is patterned into a gate pattern, for example, a resist mask 33 used for ion-implantation of P-type impurity is formed on the patterned semiconductor film 1. Then, P-type impurity ions 34, for example, impurity ions containing boron are implanted into the semiconductor film 1 with the resist mask 33 used as a mask. At this time, an attempt is made to dispose an end portion 35 of the resist mask 33 in the Ge high-concentration region 3.

Figure 8:
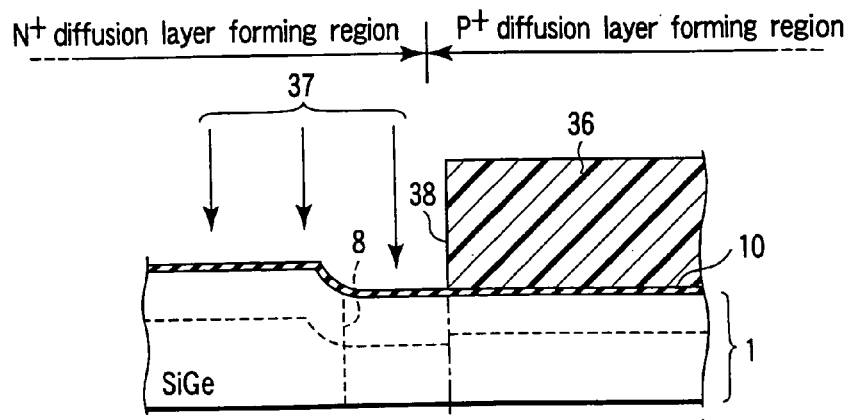
FIG. 8 is a cross sectional view showing one manufacturing step of the semiconductor device according to the first embodiment of the present invention.

Next, as shown in FIG. 8, after the resist mask 33 is removed, a resist mask 36 used for ion-implantation of N-type impurity is formed on the semiconductor film 1. Then, N-type impurity ions 37, for example, impurity ions containing phosphorus or arsenic are implanted into the semiconductor film 1 with the resist mask 36 used as a mask. At this time, an attempt is made to dispose an end portion 38 of the resist mask 36 in the Ge high-concentration region 3 like the case of the end portion 35 of the resist mask 33.

Figure 9:
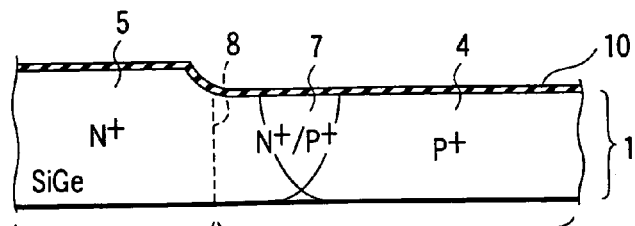
FIG. 9 is a cross sectional view showing one manufacturing step of the semiconductor device according to the first embodiment of the present invention.

After-this, as shown in FIG. 9, for example, the heat treatment is performed to activate the P-type and N-type impurities implanted into the semiconductor film 1. As a result, the P+ diffusion layer 4 and impurity mixture region 7 are formed in the Ge high-concentration region 3 of the semiconductor film 1 and the N+ diffusion layer 5 is formed in the Ge low-concentration region 2.

Figure 10:
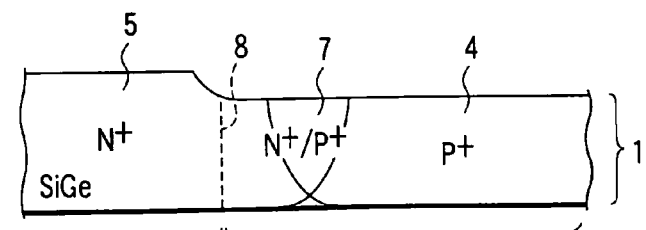
FIG. 10 is a cross sectional view showing one manufacturing step of the semiconductor device according to the first embodiment of the present invention.

Next, as shown in FIG. 10, for example, the natural oxide film 10 is etched by a wet etching process using hydrofluoric acid (for example, dilute hydrofluoric acid) or an etchant containing hydrofluoric acid. The step is a preprocessing step of forming a metal film used for forming silicide. At this time, as shown in FIG. 10, since the impurity mixture region 7 is formed inside the Ge high-concentration region 3, the natural oxide film 10 formed on the surface of the impurity mixture region 7 can be easily removed in comparison with the process explained with reference to FIGS. 33A to 33E, for example. Further, since the P+ diffusion layer 4 is formed inside the Ge high-concentration region 3 like the impurity mixture region 7, the natural oxide film 10 formed on the surface of the P+ diffusion layer 4 can be easily removed in comparison with the process explained with reference to FIGS. 34A to 34E, for example. The reason why the natural oxide film 10 can be easily removed is that the film thickness of the natural oxide film 10 can be made thinner than in a case where it is formed on silicon containing no germanium since the natural oxide film 10 is formed on silicon which contains germanium or the etching rate with respect to the hydrofluoric acid is increased. Further, a phenomenon that the film thickness of the natural oxide film 10 is made thin and a phenomenon that the etching rate with respect to the hydrofluoric acid is increased both become more significant as the germanium concentration becomes higher. That is, the film thickness of the natural oxide film 10 is made thinner on the surface of the Ge high-concentration region 3 than on the surface of the Ge low-concentration region 2. Further, the etching rate of the natural oxide film 10 with respect to the hydrofluoric acid is faster on the surface of the Ge high-concentration region 3 than on the surface of the Ge low-concentration region 2. Therefore, the ease of removal of the natural oxide film 10 formed on the surface of the P+ diffusion layer 4 and the surface of the impurity mixture region 7 can be improved substantially to the same degree of the ease of removal of the natural oxide film 10 formed on the surface of the N+ diffusion layer 5.

Figure 11:
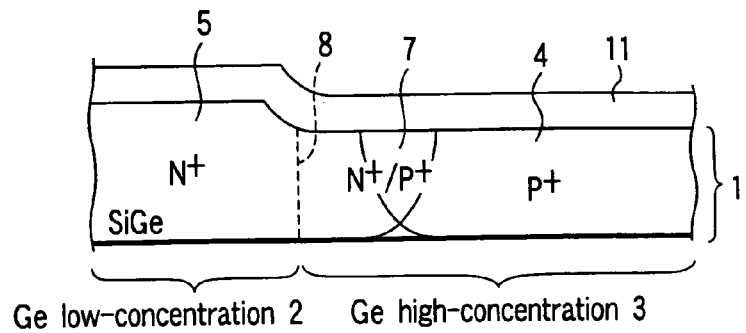
FIG. 11 is a cross sectional view showing one manufacturing step of the semiconductor device according to the first embodiment of the present invention.

Next, as shown in FIG. 11, a metal film 11 used for forming a silicide film is formed on the semiconductor film 1 from which the natural oxide film 10 is removed. In this case, any type of metal which reacts with silicon to form silicide can be used, and as an example of the material, titanium (Ti), cobalt (Co), tungsten (W), platinum (Pt), molybdenum (Mo), palladium (Pd), tantalum (Ta) and the like can be given.

Figure 12:
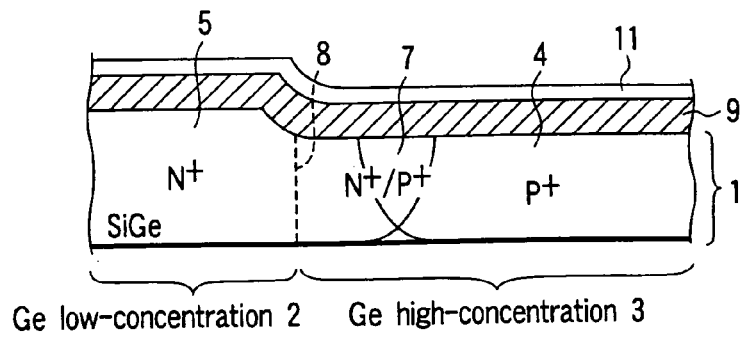
FIG. 12 is a cross sectional view showing one manufacturing step of the semiconductor device according to the first embodiment of the present invention.

As shown in FIG. 12, for example, the heat treatment is performed to react the semiconductor film 1 with the metal film 11 so as to form a silicide film 9. At this time, in the present embodiment, since the natural oxide film 10 is removed from the surface of the P+ diffusion layer 4 and the surface of the impurity mixture region 7, the silicide film 9 is continuously formed on the N+ diffusion layer 5, impurity mixture region 7 and P+ diffusion layer 4. Further, the silicide film 9 is not divided on the P+ diffusion layer 4.

Figure 13:
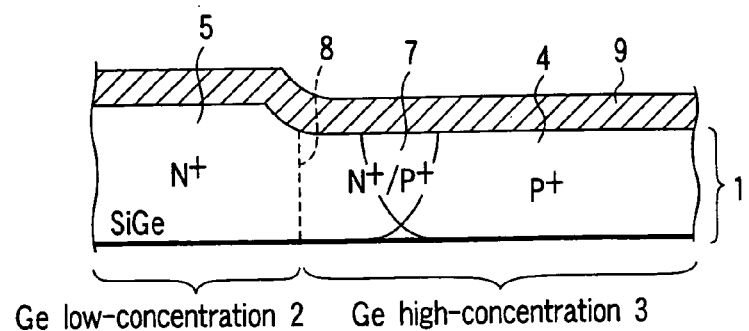
FIG. 13 is a cross sectional view showing one manufacturing step of the semiconductor device according to the first embodiment of the present invention.

Next, as shown in FIG. 13, a non-reacted portion of the metal film 11 is removed. As a result, the semiconductor film 1 whose surface is formed in a silicide form can be obtained.

According to the semiconductor device of the first embodiment, the boundary region 6 between the P+ diffusion layer 4 and the N+ diffusion layer 5 lies in the Ge high-concentration region 3. Therefore, even if the boundary region 6 contains the impurity mixture region 7, the natural oxide film 10 formed on the surface of the impurity mixture region 7 can be more easily removed in comparison with a case of the device shown in FIGS. 33A to 33E. As a result, the silicide film 9 can be more uniformly formed on the semiconductor film 1 and the junction portion between the P+ diffusion layer 4 and the N+ diffusion layer 5 can be more stably short-circuited by use of the silicide film 9. Thus, the probability that the "open" defect occurs can be more suppressed, for example.

The P+ diffusion layer 4 lies within the Ge high-concentration region 3. Therefore, the natural oxide film 10 formed on the surface of the P+ diffusion layer 4 can be more easily removed in comparison with a case of the device shown in FIGS. 34A to 34E, for example. As a result, the probability that the silicide film 9 is divided on the P+ diffusion layer 4 can be more suppressed. Thus, an increase in the resistance on the P+ diffusion layer 4 can be suppressed, for example.

Further, it becomes easier to remove the natural oxide film 10 formed on the surface of the impurity mixture region 7 and the natural oxide film 10 formed on the surface of the P+ diffusion layer 4. The ease of removal of the respective natural oxide films can be improved substantially to the same degree of the ease of removal of the natural oxide film 10 formed on the surface of the N+ diffusion layer 5, for example. Therefore, a variation in the ease of removal of the natural oxide films 10 can be made small and, for example, it is not necessary to increase an etching amount of the natural oxide film 10. As a result, problems caused by excessive etching, for example, a problem that an insulated gate field effect transistor will not be operated or a problem that the junction leak will increase as explained with reference to FIGS. 35 to 39 can be solved.

With the above semiconductor device, it becomes easy to enhance the manufacturing yield and reduce variation in the characteristics of the elements.

Further, another advantage can be attained by making the germanium concentration in the P+ diffusion layer 4 higher than the germanium concentration in the N+ diffusion layer.

For example, in an N-channel insulated gate field effect transistor (which is hereinafter briefly referred to as an NMOS for convenience) in which the N+ diffusion layer 5 is formed in the gate electrode, the activation rate of N-type impurity contained in the N+ diffusion layer 5 becomes maximum when the germanium concentration in the gate electrode is approximately 30 mol %.

On the other hand, in a P-channel insulated gate field effect transistor (which is hereinafter briefly referred to as a PMOS for convenience) in which the P+ diffusion layer 4 is formed in the gate electrode, the activation rate of P-type impurity contained in the P+ diffusion layer 4 becomes higher as the germanium concentration in the gate electrode is higher.

That is, in the semiconductor device according to the first embodiment, the germanium concentration of the semiconductor film 1 lying in a region in which the NMOS is formed is set to such a value that the activation rate of N-type impurity contained in the N+ diffusion layer 5 will become maximum. Then, the germanium concentration of the semiconductor film 1 lying in a region in which the PMOS is formed is set to exceed the concentration which causes the activation rate to become maximum. One example of the concentration which causes the activation rate to become maximum is approximately 30 mol % as described above.

By thus setting the concentration, both of the activation rate of N-type impurity contained in the diffusion layer formed in the gate electrode and the activation rate of P-type impurity can be enhanced. If the activation rates of the impurities are enhanced, a depletion layer formed in the gate electrode becomes thin and the "apparent thickness" of the gate insulating film obtained by adding the thickness of the gate insulating film formed under the gate electrode to the thickness of the depletion layer can be made thin. If the "apparent thickness" of the gate insulating film becomes thin, for example, an advantage that the ON-OFF characteristic in the insulated gate field effect transistor can be improved can be attained and it is effective to optimize the element characteristic.

Figure 1B:
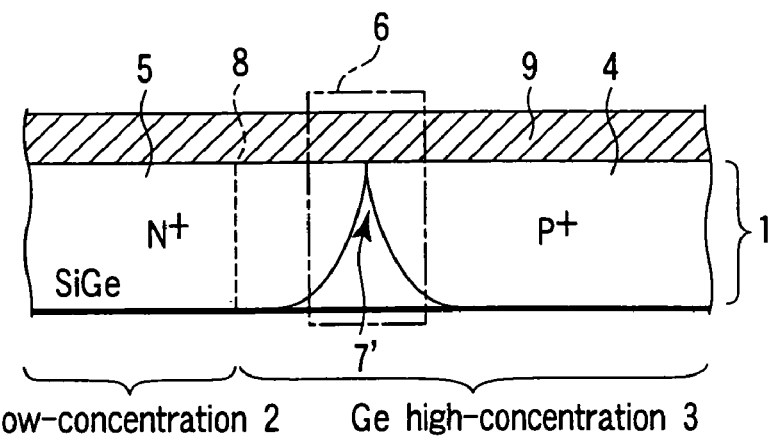
FIG. 1B is a cross sectional view showing a semiconductor device according to a first modification of the first embodiment of the present invention.
Figure 1C:
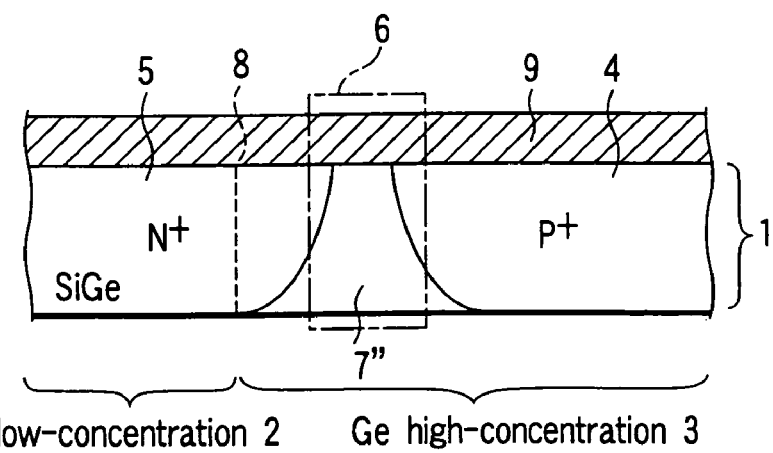
FIG. 1C is a cross sectional view showing a semiconductor device according to a second modification of the first embodiment of the present invention.

FIG. 1B is a cross sectional view showing a semiconductor device according to a first modification of the first embodiment of the present invention and FIG. 1C is a cross sectional view showing a semiconductor device according to a second modification of the first embodiment of the present invention.

In the first embodiment, the boundary region 6 contains the impurity mixture region 7. However, the impurity mixture region 7 may not be contained in the boundary region 6.

For example, as shown in FIG. 1B, a contact region 7' in which the P+ diffusion layer 4 and the N+ diffusion layer 5 are formed in contact with each other may be contained in the boundary region 6.

Further, for example, as shown in FIG. 1C, an undoped region 7" containing none of P-type and N-type impurities may be contained in the boundary region 6.

Second Embodiment

The second embodiment is associated with an example of a case wherein the first embodiment is applied to a CMOS semiconductor device.

Figure 14A:
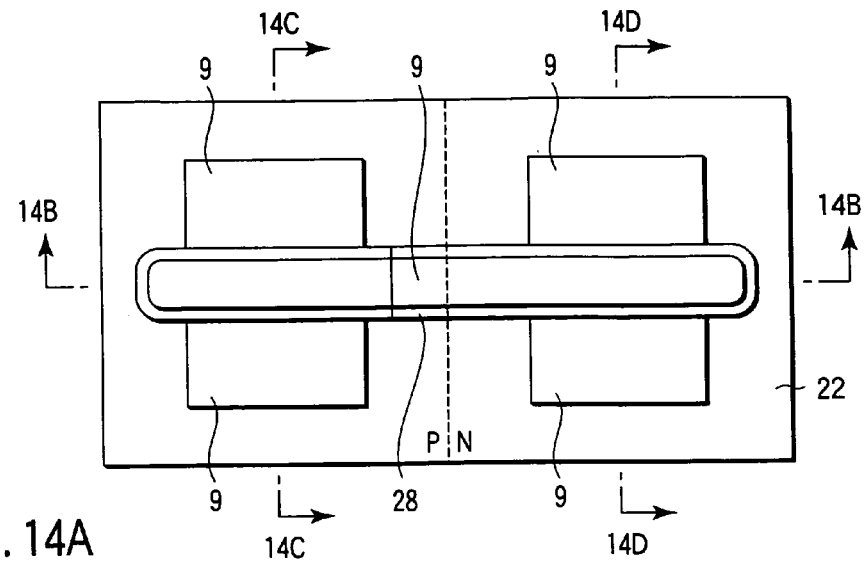
FIG. 14A is a plan view showing a semiconductor device according to a second embodiment of the present invention.
Figure 14B:
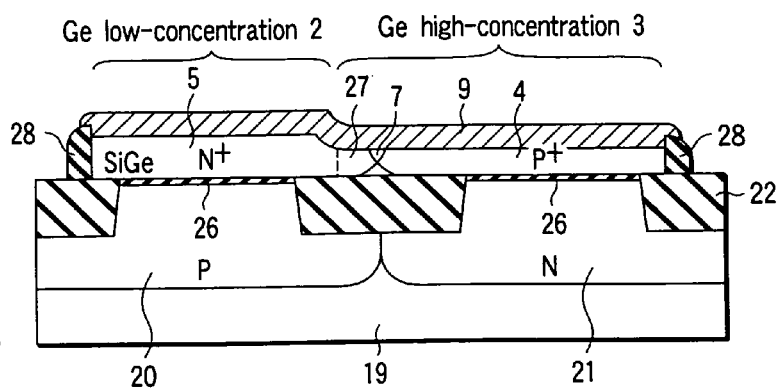
FIG. 14B is a cross sectional view taken along the 14B—14B line of FIG. 14A.
Figure 14C:
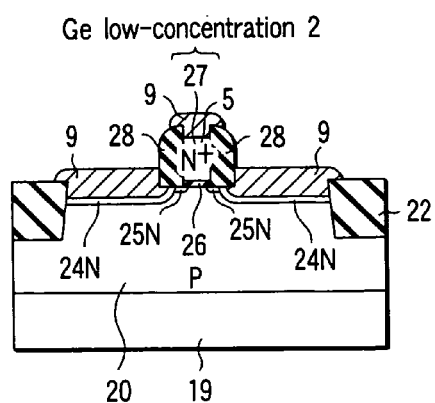
FIG. 14C is a cross sectional view taken along the 14C—14C line of FIG. 14A.
Figure 14D:
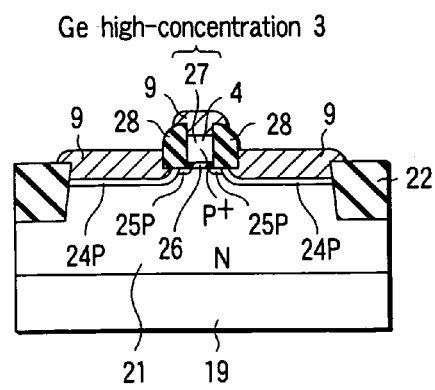
FIG. 14D is a cross sectional view taken along the 14D—14D line of FIG. 14A.
Figure 15A:
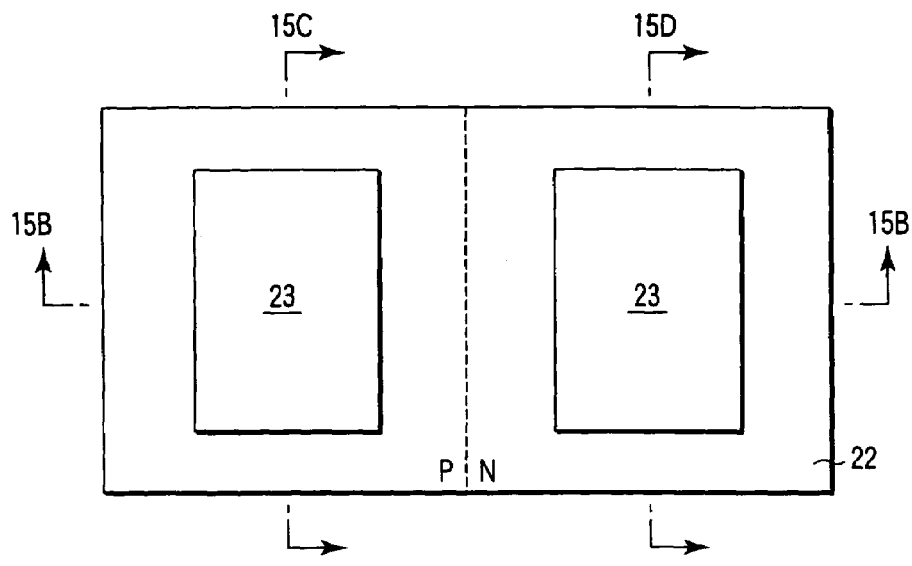
FIG. 15A is a plan view showing one manufacturing method of the semiconductor device according to the second embodiment of the present invention.
Figure 15B:
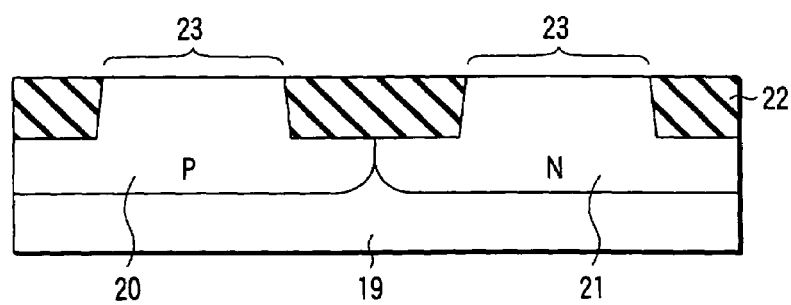
FIG. 15B is a cross sectional view taken along the 15B—15B line of FIG. 15A.
Figure 15C:
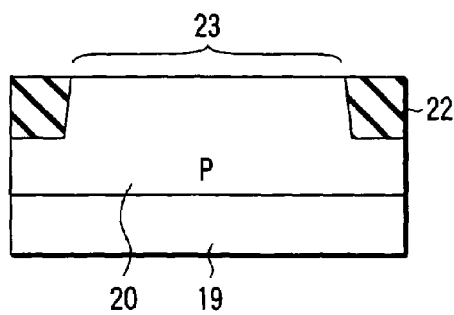
FIG. 15C is a cross sectional view taken along the 15C—15C line of FIG. 15A.
Figure 15D:
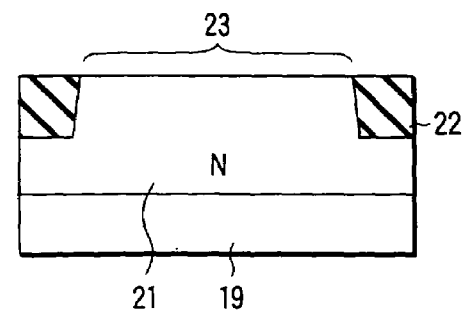
FIG. 15D is a cross sectional view taken along the 15D—15D line of FIG. 15A.
Figure 16A:
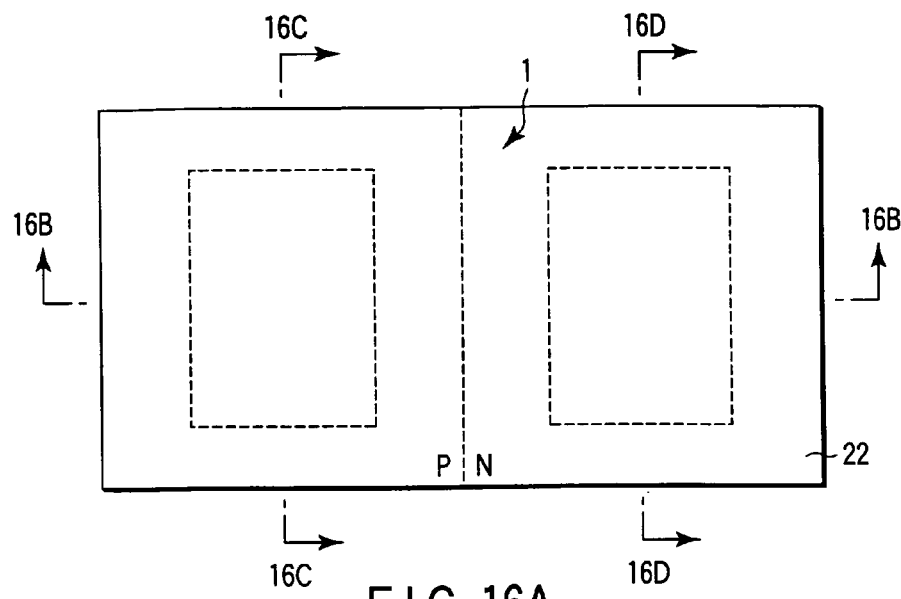
FIG. 16A is a plan view showing one manufacturing method of the semiconductor device according to the second embodiment of the present invention.
Figure 16B:
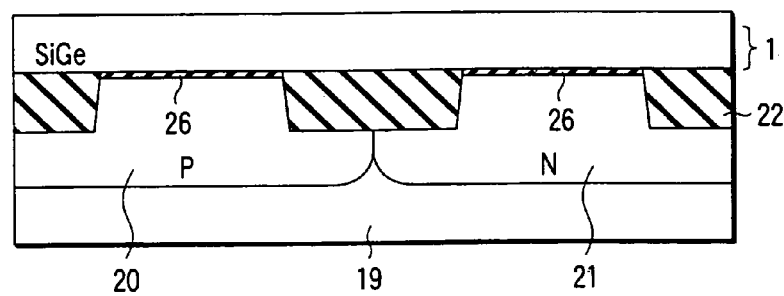
FIG. 16B is a cross sectional view taken along the 16B—16B line of FIG. 16A.
Figure 16C:
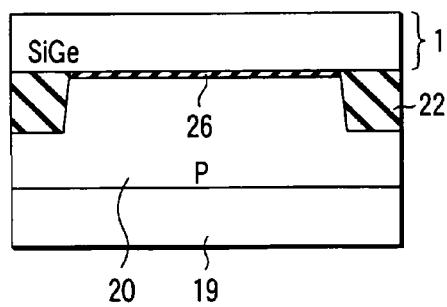
FIG. 16C is a cross sectional view taken along the 16C—16C line of FIG. 16A.
Figure 16D:
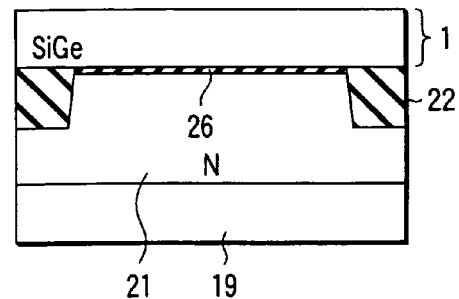
FIG. 16D is a cross sectional view taken along the 16D—16D line of FIG. 16A.
Figure 17A:
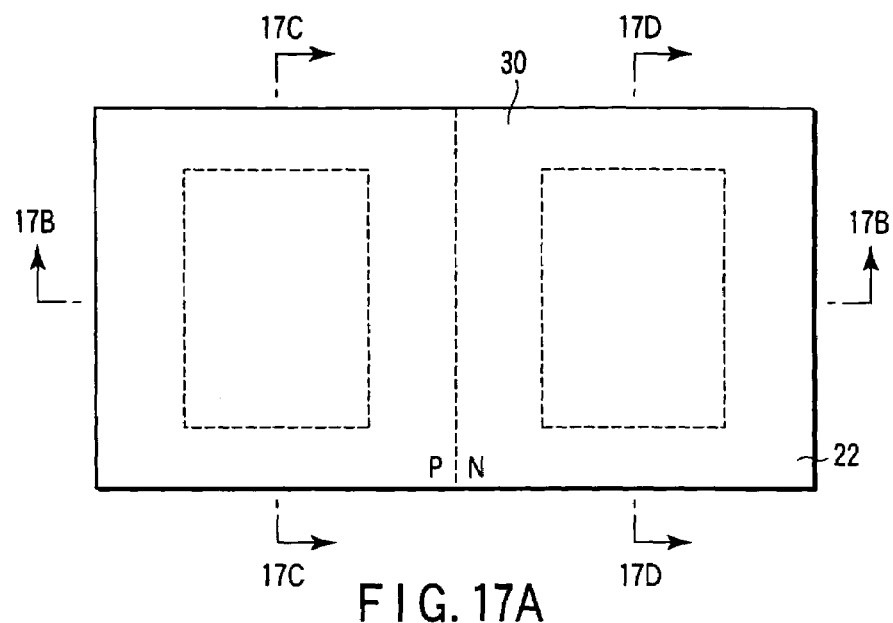
FIG. 17A is a plan view showing one manufacturing method of the semiconductor device according to the second embodiment of the present invention.
Figure 17B:
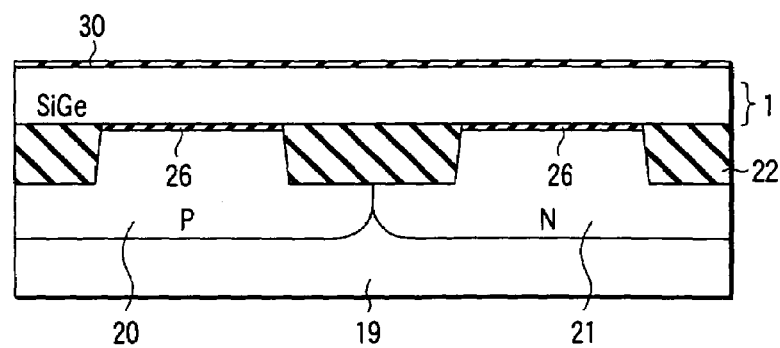
FIG. 17B is a cross sectional view taken along the 17B—17B line of FIG. 17A.
Figure 17C:
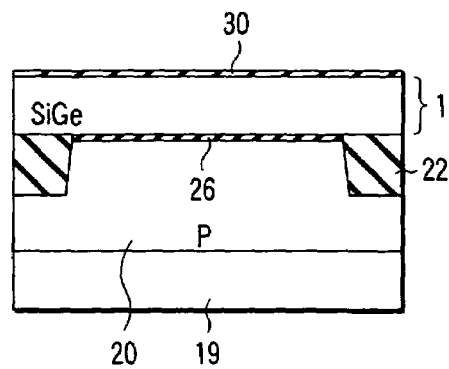
FIG. 17C is a cross sectional view taken along the 17C—17C line of FIG. 17A.
Figure 17D:
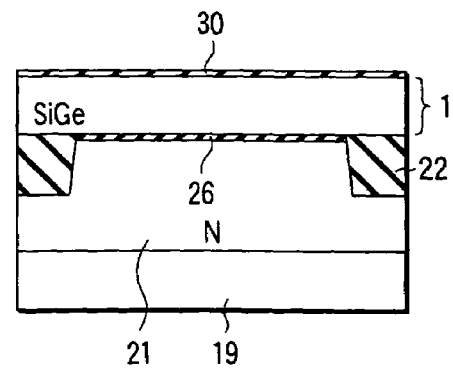
FIG. 17D is a cross sectional view taken along the 17D—17D line of FIG. 17A.
Figure 19A:
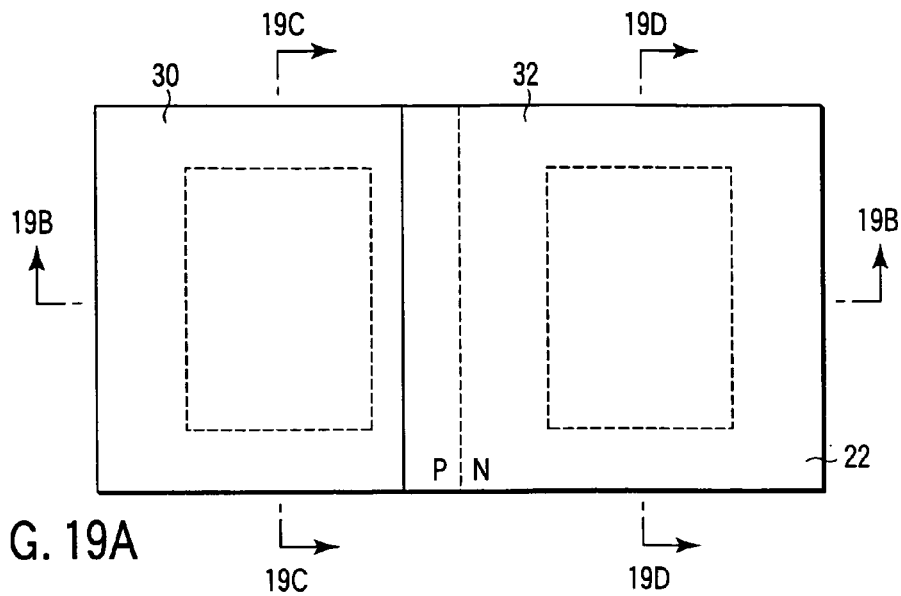
FIG. 19A is a plan view showing one manufacturing method of the semiconductor device according to the second embodiment of the present invention.
Figure 19B:
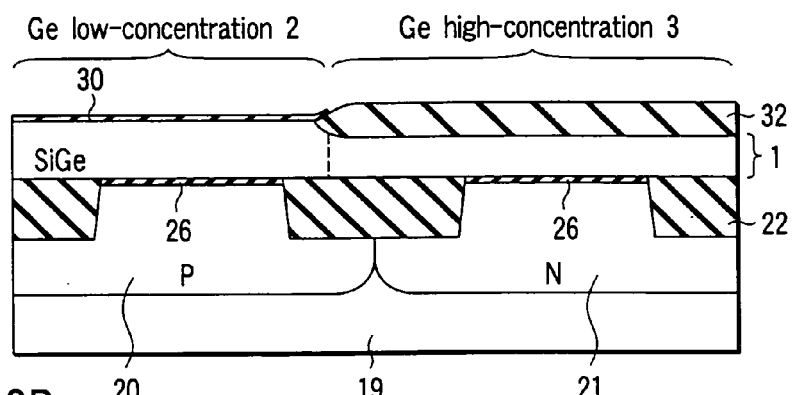
FIG. 19B is a cross sectional view taken along the 19B—19B line of FIG. 19A.
Figures 19C, 19D:
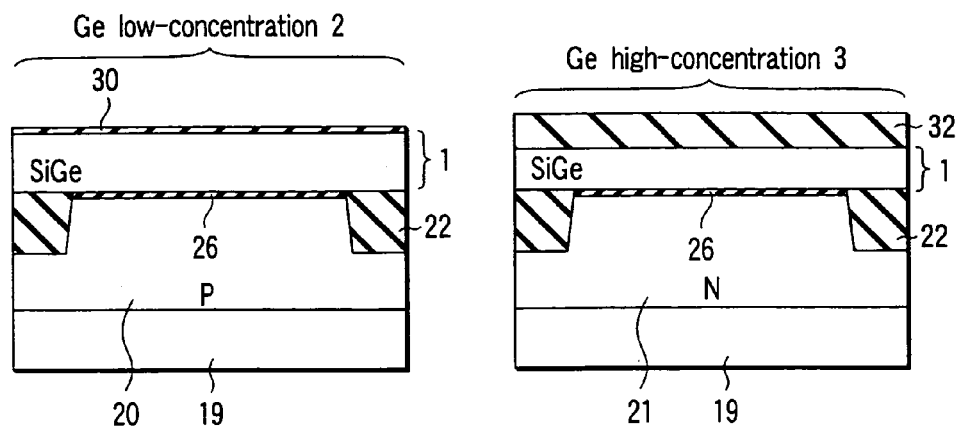
FIG. 19C is a cross sectional view taken along the 19C—19C line of FIG. 19A.
FIG. 19D is a cross sectional view taken along the 19D—19D line of FIG. 19A.
Figure 20A:
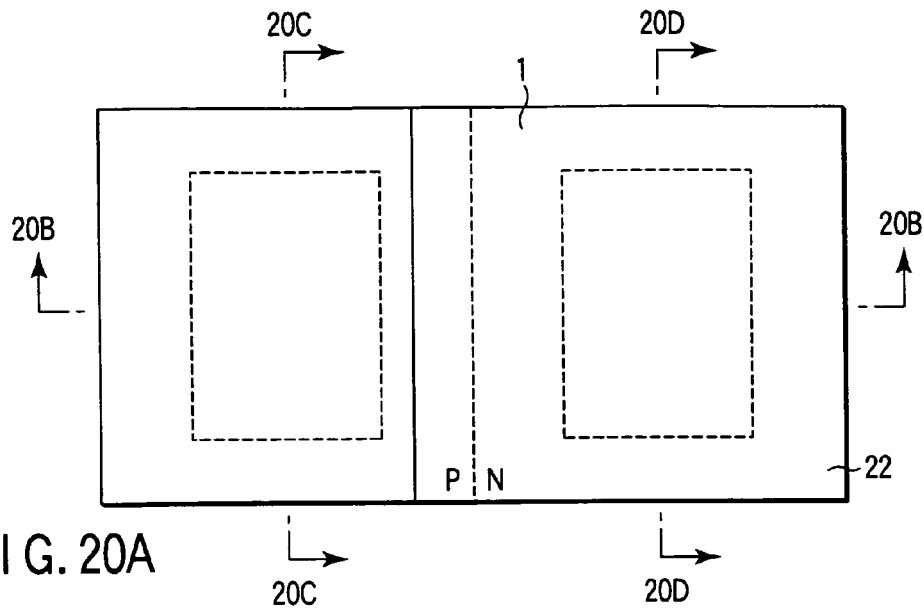
FIG. 20A is a plan view showing one manufacturing method of the semiconductor device according to the second embodiment of the present invention.
Figure 20B:
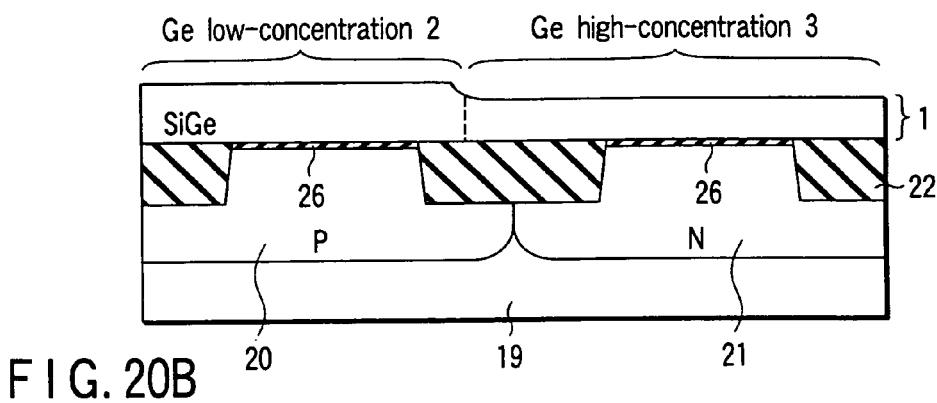
FIG. 20B is a cross sectional view taken along the 20B—20B line of FIG. 20A.
Figures 20C, 20D:
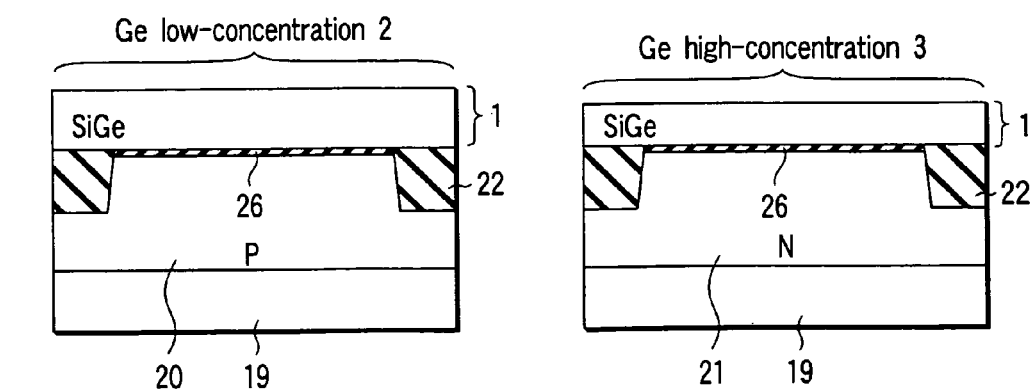
FIG. 20C is a cross sectional view taken along the 20C—20C line of FIG. 20A.
FIG. 20D is a cross sectional view taken along the 20D—20D line of FIG. 20A.
Figure 21A:
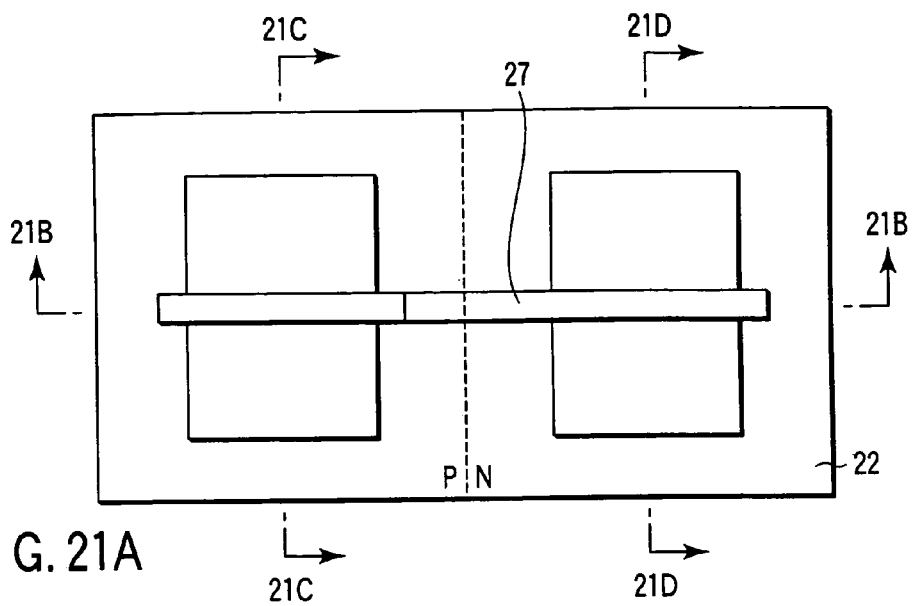
FIG. 21A is a plan view showing one manufacturing method of the semiconductor device according to the second embodiment of the present invention.
Figure 21B:
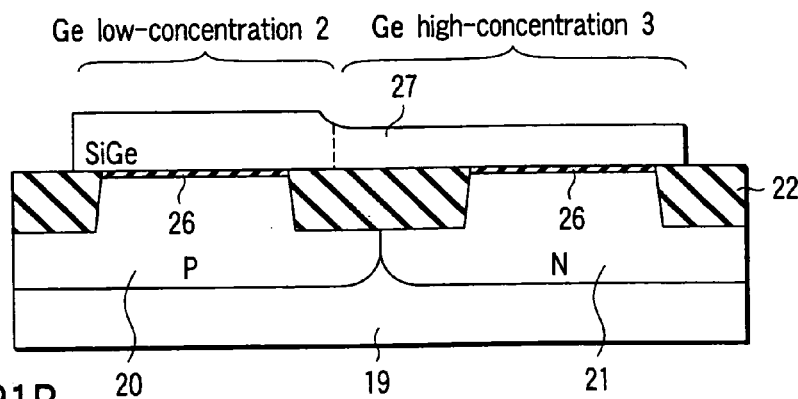
FIG. 21B is a cross sectional view taken along the 21B—21B line of FIG. 21A.
Figures 21C, 21D:
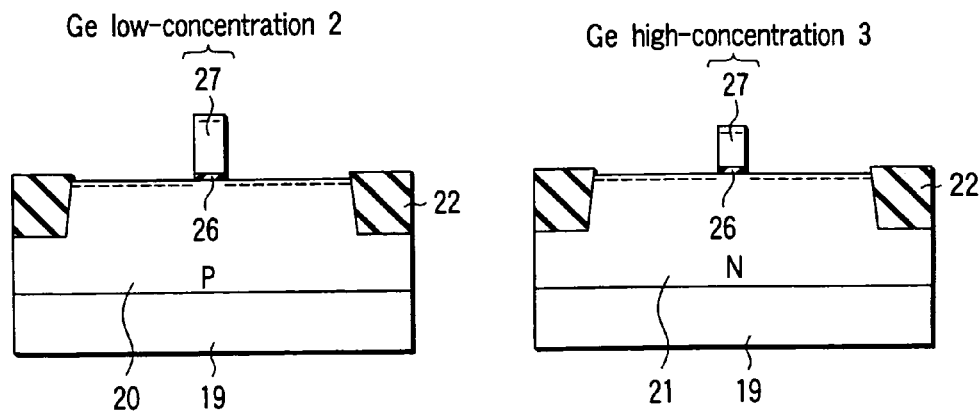
FIG. 21C is a cross sectional view taken along the 21C—21C line of FIG. 21A.
FIG. 21D is a cross sectional view taken along the 21D—21D line of FIG. 21A.
Figure 22A:
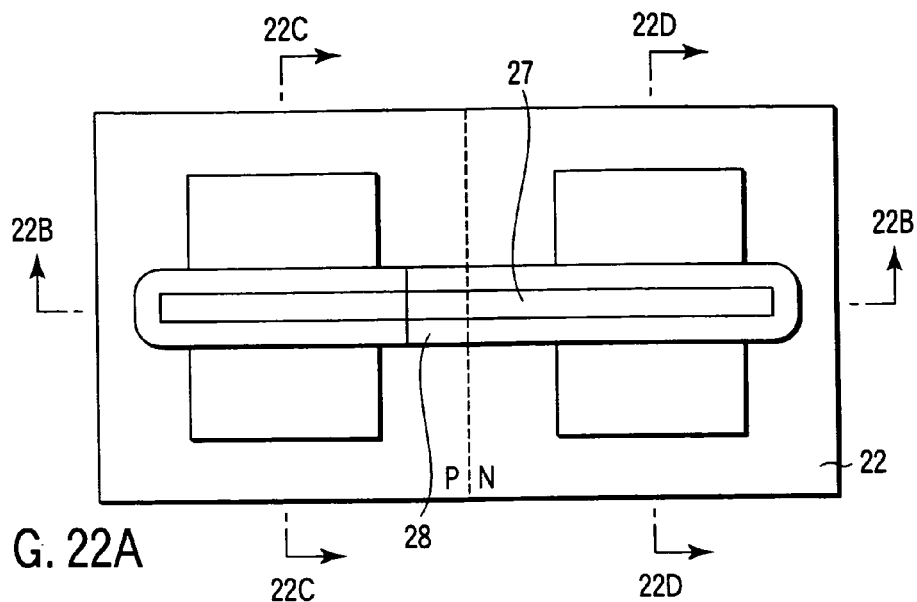
FIG. 22A is a plan view showing one manufacturing method of the semiconductor device according to the second embodiment of the present invention.
Figure 22B:
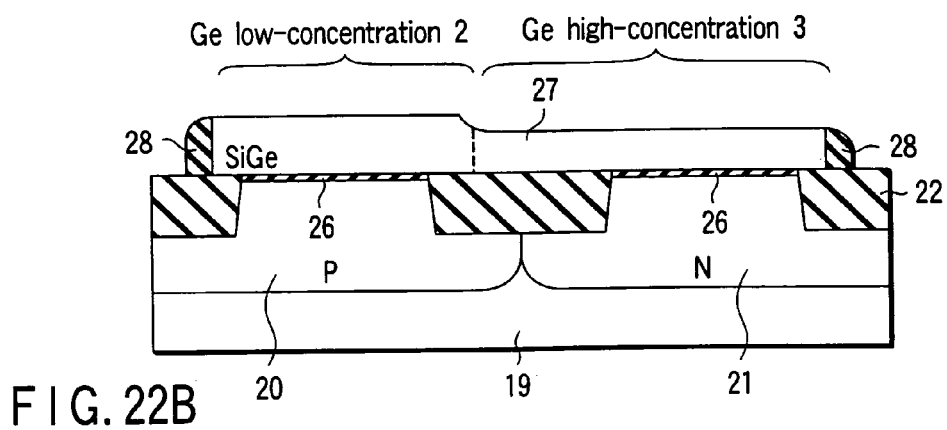
FIG. 22B is a cross sectional view taken along the 22B—22B line of FIG. 22A.
Figures 22C, 22D:
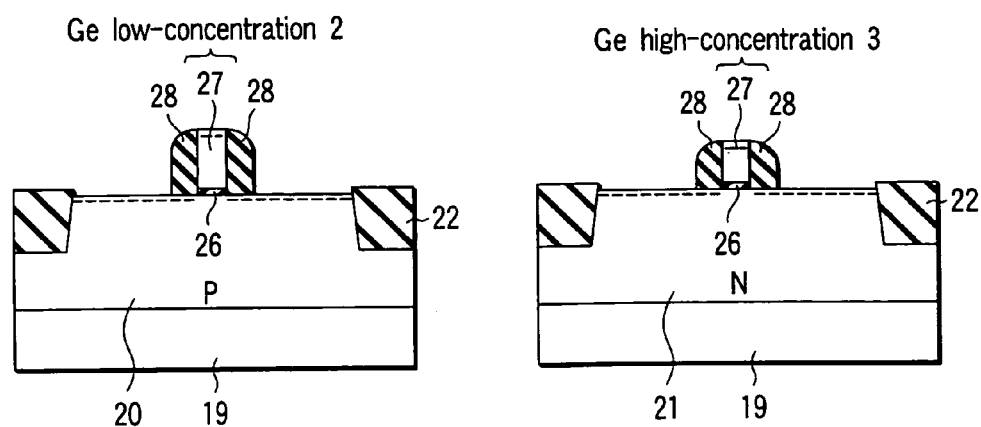
FIG. 22C is a cross sectional view taken along the 22C—22C line of FIG. 22A.
FIG. 22D is a cross sectional view taken along the 22D—22D line of FIG. 22A.
Figure 23A:
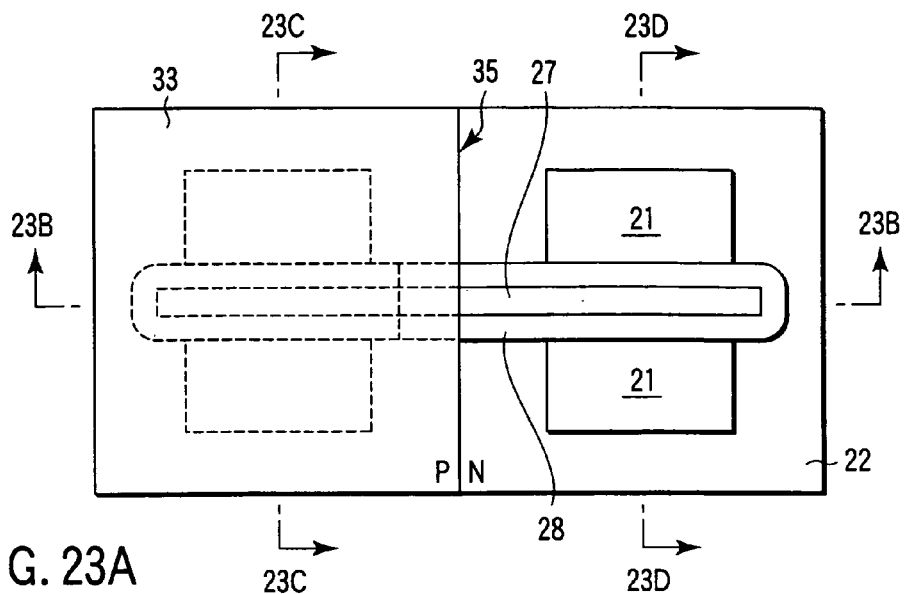
FIG. 23A is a plan view showing one manufacturing method of the semiconductor device according to the second embodiment of the present invention.
Figure 23B:
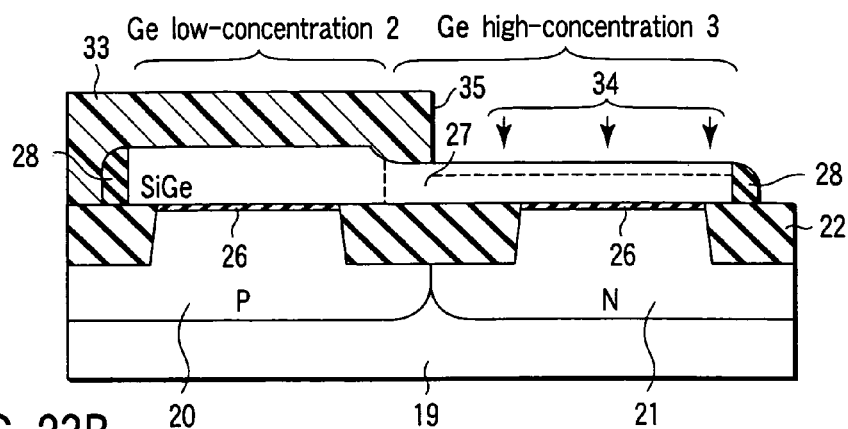
FIG. 23B is a cross sectional view taken along the 23B—23B line of FIG. 23A.
Figures 23C, 23D:
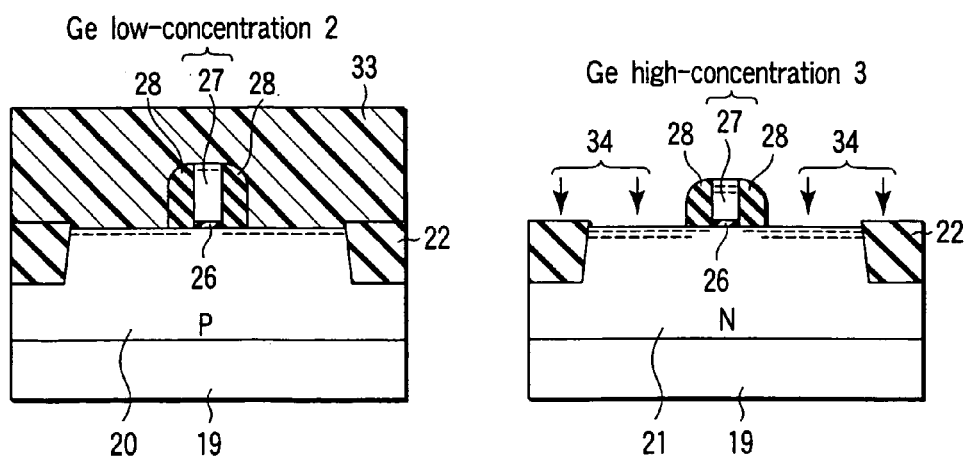
FIG. 23C is a cross sectional view taken along the 23C—23C line of FIG. 23A.
FIG. 23D is a cross sectional view taken along the 23D—23D line of FIG. 23A.
Figure 24A:
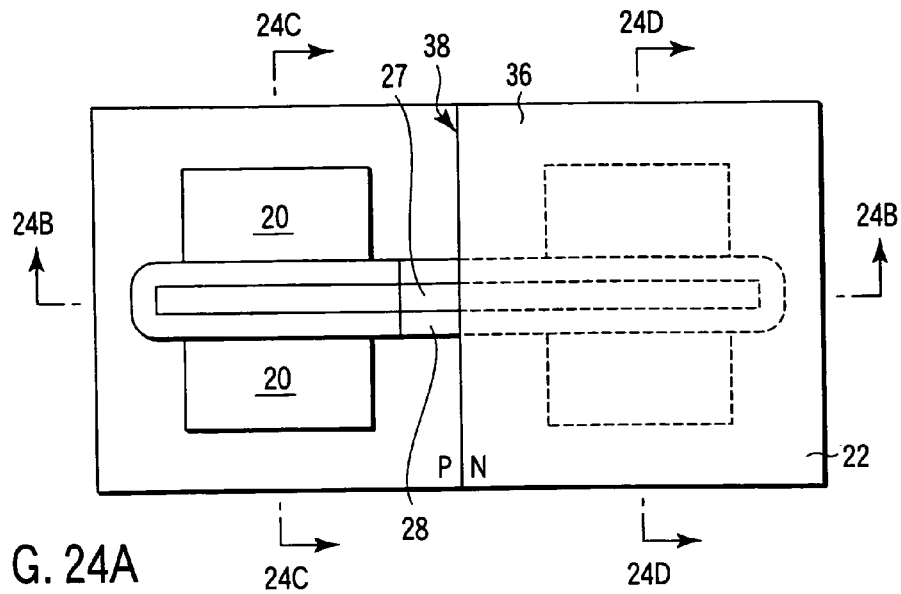
FIG. 24A is a plan view showing one manufacturing method of the semiconductor device according to the second embodiment of the present invention.
Figure 24B:
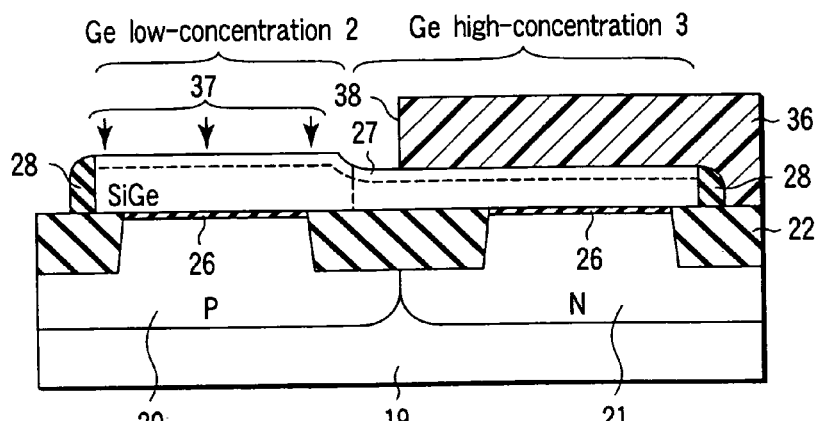
FIG. 24B is a cross sectional view taken along the 24B—24B line of FIG. 24A.
Figures 24C, 24D:
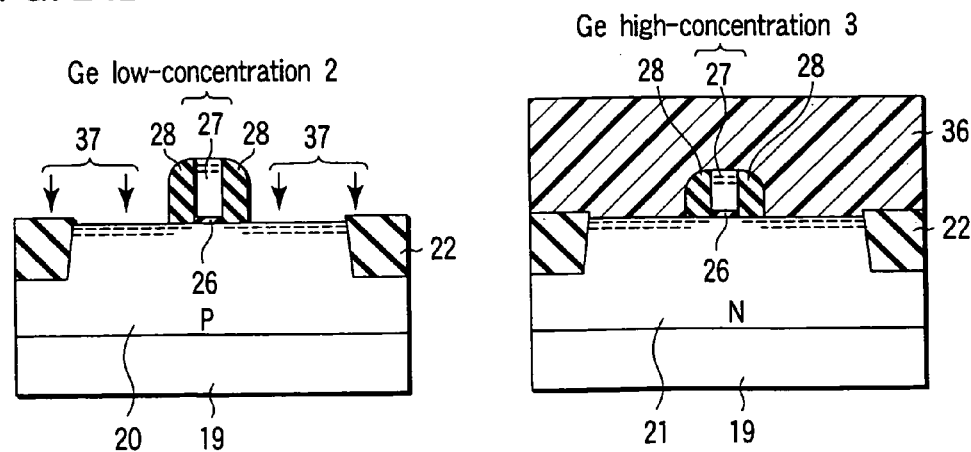
FIG. 24C is a cross sectional view taken along the 24C—24C line of FIG. 24A.
FIG. 24D is a cross sectional view taken along the 24D—24D line of FIG. 24A.
Figure 26A:
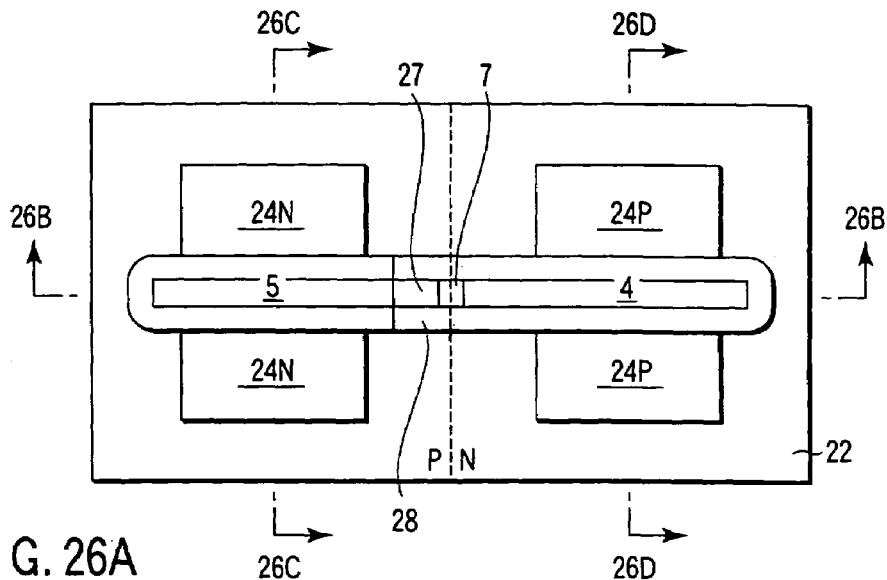
FIG. 26A is a plan view showing one manufacturing method of the semiconductor device according to the second embodiment of the present invention.
Figure 26B:
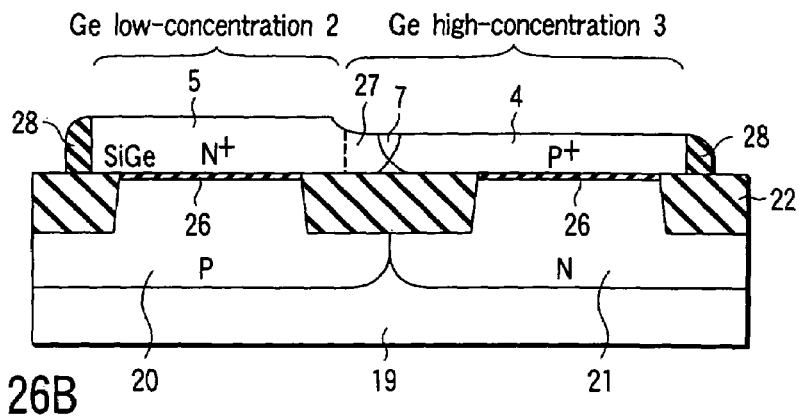
FIG. 26B is a cross sectional view taken along the 26B—26B line of FIG. 26A.
Figures 26C, 26D:
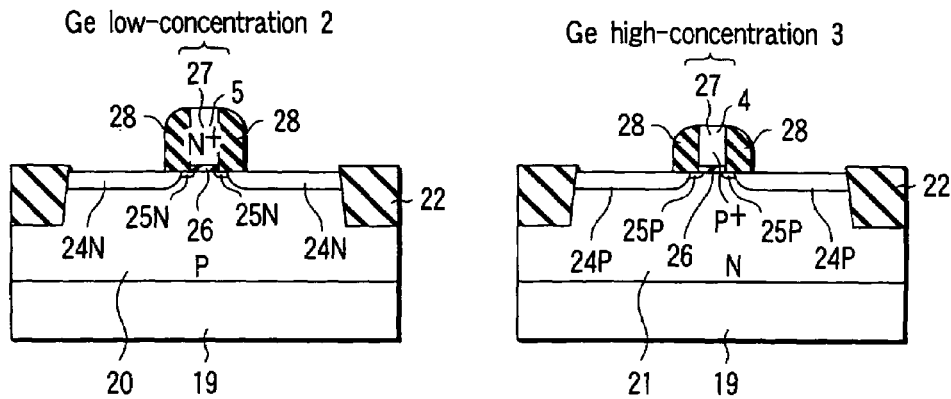
FIG. 26C is a cross sectional view taken along the 26C—26C line of FIG. 26A.
FIG. 26D is a cross sectional view taken along the 26D—26D line of FIG. 26A.
Figure 27A:
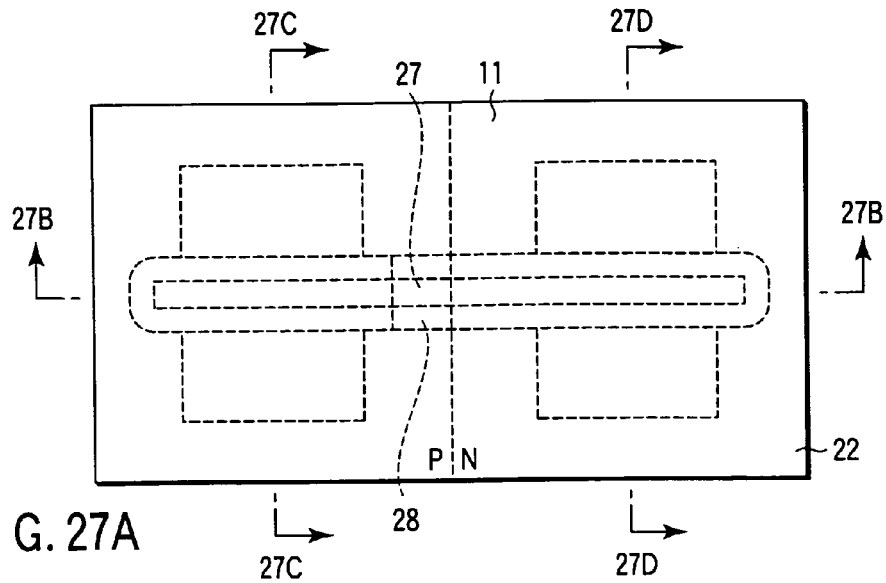
FIG. 27A is a plan view showing one manufacturing method of the semiconductor device according to the second embodiment of the present invention.
Figure 27B:
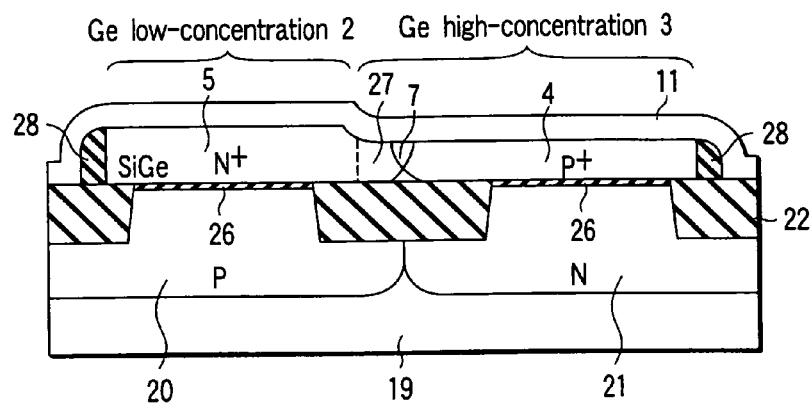
FIG. 27B is a cross sectional view taken along the 27B—27B line of FIG. 27A.
Figures 27C, 27D:
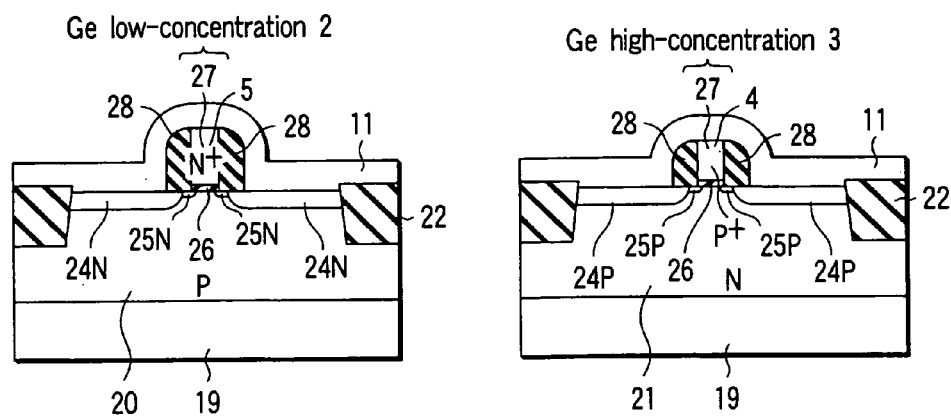
FIG. 27C is a cross sectional view taken along the 27C—27C line of FIG. 27A.
FIG. 27D is a cross sectional view taken along the 27D—27D line of FIG. 27A.
Figure 28A:
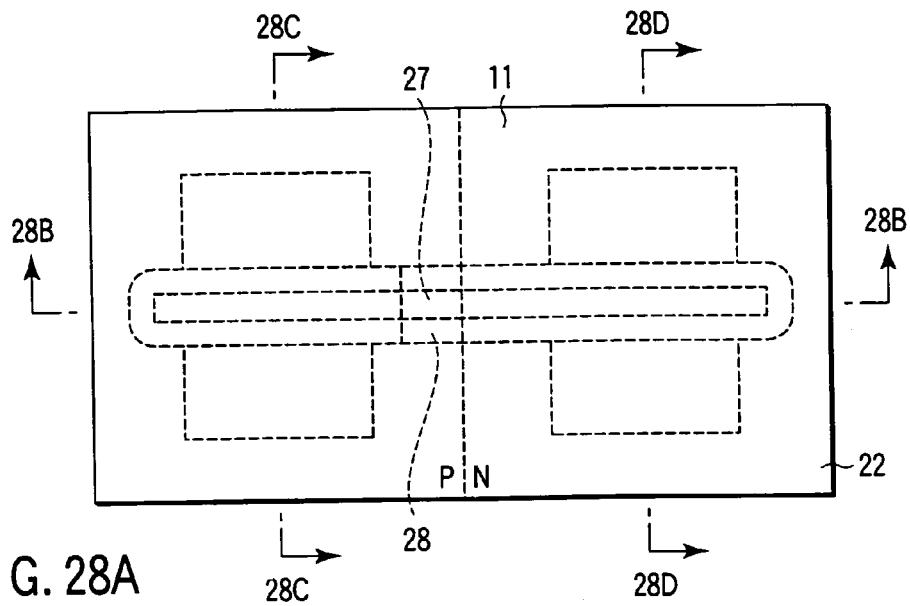
FIG. 28A is a plan view showing one manufacturing method of the semiconductor device according to the second embodiment of the present invention.
Figure 28B:
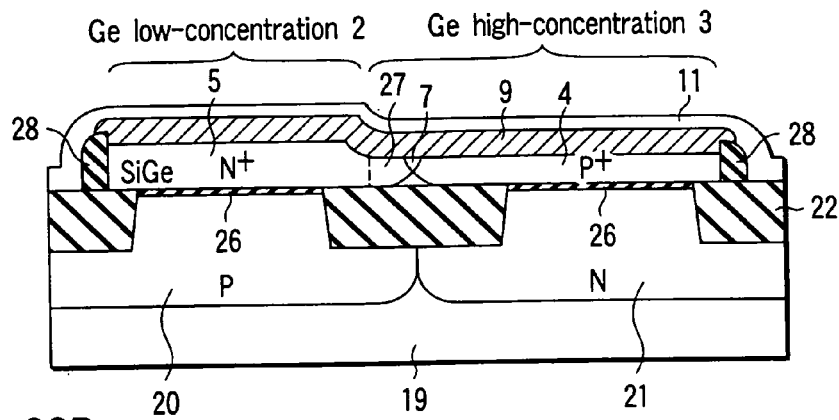
FIG. 28B is a cross sectional view taken along the 28B—28B line of FIG. 28A.
Figures 28C, 28D:
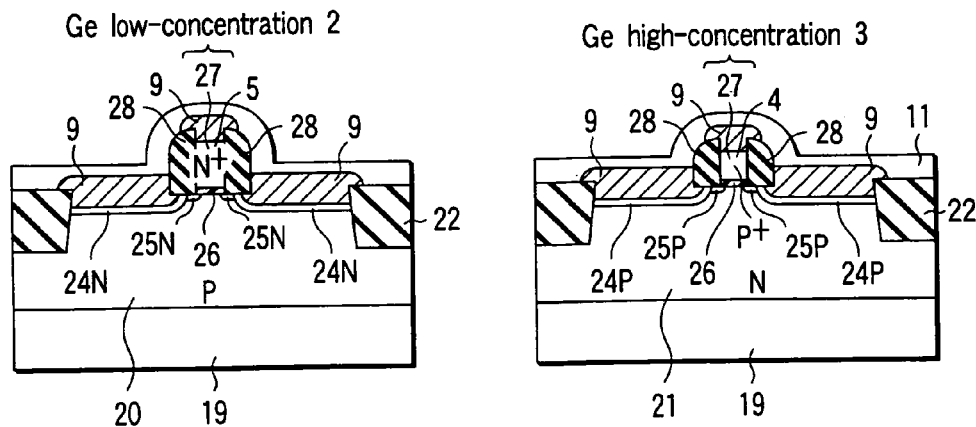
FIG. 28C is a cross sectional view taken along the 28C—28C line of FIG. 28A.
FIG. 28D is a cross sectional view taken along the 28D—28D line of FIG. 28A.

FIG. 14A is a plan view showing a semiconductor device according to the second embodiment of the present invention, FIG. 14B is a cross sectional view taken along the 14B—14B line of FIG. 14A, FIG. 14C is a cross sectional view taken along the 14C—14C line of FIG. 14A, and FIG. 14D is a cross sectional view taken along the 14D—14D line of FIG. 14A.

The semiconductor device according to the second embodiment is explained according to one example of the manufacturing method below.

FIGS. 15A to 15D, . . . , FIGS. 28A to 28D are plan views or cross sectional views showing the semiconductor device of the first embodiment according to one example of the manufacturing method.

First, as shown in FIGS. 15A to 15D, a P-type semiconductor region 20 in which a first transistor is to be formed and an N-type semiconductor region 21 in which a second transistor is to be formed are formed on a substrate 19. In this example, the substrate 19 is a semiconductor substrate, for example, a P-type or N-type silicon substrate. The P-type semiconductor region 20 is a P-type well and the N-type semiconductor region 21 is an N-type well. Then, an element isolation region 22 is formed in the surface regions of the P-type well and N-type well to define element regions 23 in the P-type well and N-type well. One example of the material of the element isolation region 22 is silicon dioxide.

Next, as shown in FIGS. 16A to 16D, the surfaces of the element regions 23 are oxidized to form gate insulating films 26. After this, a semiconductor film 1 is formed on the element isolation region 22 and gate insulating films 26. Like the first embodiment, silicon and germanium are contained in the semiconductor film 1 of this example.

Then, as shown in FIGS. 17A to 17D, an oxidation-resistant film 30 is formed on the semiconductor film 1. One example of the material of the oxidation-resistant film 30 is silicon nitride like the case of the first embodiment.

Next, as shown in FIGS. 18A to 18D, the oxidation-resistant film 30 is patterned to expose the surface of a portion of the semiconductor film 1 which corresponds to a P+ diffusion layer forming region. At this time, an end portion 31 of the oxidation-resistant film 30 is disposed inside an N+ diffusion layer forming region like the case of the first embodiment.

After this, as shown in FIGS. 19A to 19D, the surface of the semiconductor film 1 is oxidized to form a silicon oxide film 32 with the oxidation-resistant film 30 used as a mask. As a result, like the first embodiment, a region 2 in which the Ge concentration is low and a region 3 in which the Ge concentration is high are formed on the semiconductor film 1.

Next, as shown in FIGS. 20A to 20D, the oxidation-resistant film 30 and silicon oxide film 32 are removed from the semiconductor film 1.

After this, as shown in FIGS. 21A to 21D, the semiconductor film 1 is patterned into a gate pattern of a gate electrode 27. Then, P-type and N-type impurity ions used to form extensions are respectively implanted into the N-type semiconductor region 21 and P-type semiconductor region 20 while the gate electrode 27, element isolation region 22 and resist mask which is not shown in the drawing are used as a mask.

Next, as shown in FIGS. 22A to 22D, insulator such as silicon dioxide is deposited on the structure shown in FIGS. 21A to 21D to form an insulating film. Then, the insulating film is subjected to an anisotropic etching process to form a side wall insulating film 28 on the side walls of the gate electrode 27.

After this, as shown in FIGS. 23A to 23D, a resist mask 33 is formed on a portion of the gate electrode 27 which lies above the P-type semiconductor region 20 and on the side wall insulating film 28, P-type semiconductor region 20 and element isolation region 22. Then, P-type impurity ions 34 are implanted into the gate electrode 27 and N-type semiconductor region 21 with the resist mask 33 used as a mask. At this time, an end portion 35 of the resist mask 33 is disposed in the Ge high-concentration region 3 like the case of the first embodiment.

Next, as shown in FIGS. 24A to 24D, after the resist mask 33 is removed, a resist mask 36 is formed on a portion of the gate electrode 27 which lies above the N-type semiconductor region 21 and on the side wall insulating film 28, N-type semiconductor region 21 and element isolation region 22. Then, N-type impurity ions 37 are implanted into the gate electrode 27 and P-type semiconductor region 20 with the resist mask 36 used as a mask. At this time, an end portion 38 of the resist mask 36 is disposed in the Ge high-concentration region 3 like the case of the first embodiment.

Next, as shown in FIGS. 25A to 25D, for example, the heat treatment is performed to activate the P-type and N-type impurities implanted into the P-type semiconductor region 20, N-type semiconductor region 21 and gate electrode 27. As a result, a P+ diffusion layer 4 and impurity mixture region 7 are formed in the Ge high-concentration region 3 of the gate electrode 27 and an N+ diffusion layer 5 is formed in the Ge low-concentration region 2. Further, on the P-type semiconductor region 20, N+ diffusion layers 24N which act as the source and drain regions of the NMOS and N− diffusion layers 25N which act as the source extension and drain extension of the NMOS are formed. On the N-type semiconductor region 21, P+ diffusion layers 24P which act as the source and drain regions of the PMOS and P− diffusion layers 25P which act as the source extension and drain extension of the PMOS are formed. In FIGS. 25A to 25D, natural oxide films 10 formed on the surfaces of the gate electrode 7, N+ diffusion layers 24N and P+ diffusion layers 24P are shown.

Next, as shown in FIGS. 26A to 26D, for example, the natural oxide film 10 is etched by a wet etching process using hydrofluoric acid (for example, dilute hydrofluoric acid) or an etchant containing hydrofluoric acid. The step is a preprocessing step of forming a metal film used for forming silicide. At this time, as shown in the drawing, since the impurity mixture region 7 is formed inside the Ge high-concentration region 3, the natural oxide film 10 formed on the surface of the impurity mixture region 7 can be easily removed like the case of the first embodiment. Further, since the P+ diffusion layer 4 is formed inside the Ge high-concentration region 3, the natural oxide film 10 formed on the surface of the P+ diffusion layer 4 can be easily removed like the case of the first embodiment. Further, since the natural oxide film 10 can be easily removed, it is unnecessary to increase the etching amount of the natural oxide film 10 unlike the case of the process explained with reference to FIGS. 35 to 39. Therefore, a reduction in the film thickness of the element isolation region 22 and side wall insulating film 28 can be suppressed in comparison with a case of the process explained with reference to FIGS. 35 to 39.

Next, as shown in FIGS. 27A to 27D, a metal film 11 is formed on the surfaces of the gate electrode 27, side wall insulating film 28, P-type semiconductor region 20, N-type semiconductor region 21 and element isolation region 22 from which the natural oxide film 10 is removed.

As shown in FIGS. 28A to 28D, for example, the heat treatment is performed to react the gate electrode 27, P-type semiconductor region 20 and N-type semiconductor region 21 with the metal film 11 so as to form a silicide film 9. At this time, in the present embodiment, since the natural oxide film 10 is removed from the surfaces of the P+ diffusion layer 4 and impurity mixture region 7, particularly, the silicide film 9 formed on the gate electrode 27 is continuously formed on the N+ diffusion layer 5, impurity mixture region 7 and P+ diffusion layer 4. Further, the silicide film 9 is not divided on the P+ diffusion layer 4.

Next, as shown in FIGS. 14A to 14D, a non-reacted portion of the metal film 11 is removed. As a result, a CMOS semiconductor device having the gate electrode 27, N+ diffusion layer 24N and P+ diffusion layer 24P whose surfaces are formed in a silicide form can be obtained.

In the semiconductor device according to the second embodiment, the boundary region 6 between the P+ diffusion layer 4 and the N+ diffusion layer 5 is formed in the Ge high-concentration region 3. Further, the P+ diffusion layer 4 lies in the Ge high-concentration region 3. Therefore, the same effect as that of the first embodiment can be attained.

Third Embodiment

Like the second embodiment, the third embodiment is associated with an example of a case wherein the first embodiment is applied to a CMOS semiconductor device.

FIG. 29A is a plan view showing a semiconductor device according to the third embodiment of the present invention, FIG. 29B is a cross sectional view taken along the 29B—29B line of FIG. 29A, FIG. 29C is a cross sectional view taken along the 29C—29C line of FIG. 29A, and FIG. 29D is a cross sectional view taken along the 29D—29D line of FIG. 29A.

As shown in FIGS. 29A to 29D, the third embodiment is similar to the second embodiment except that an SiGe substrate containing silicon and germanium is used as a substrate 19, a Ge low-concentration region 2' containing germanium of low concentration and a Ge high-concentration region 3' containing germanium of high concentration are formed on the SiGe substrate, an N-type semiconductor region 21 on which P+ diffusion layers 24P are formed is formed in the Ge high-concentration region 3', and a P-type semiconductor region 20 on which N+ diffusion layers 24N are formed is formed in the Ge low-concentration region 2'. With the above structure, a PMOS is formed in the Ge high-concentration region 3' and an NMOS is formed in the Ge low-concentration region 2'.

A natural oxide film formed on the surface of the P+ diffusion layer is more difficult to remove than a natural oxide film formed on the surface of the N+ diffusion layer as described before.

Therefore, in the third embodiment, it is possible to attain an advantage that the natural oxide film formed on the surface of the P+ diffusion layer 24P can be easily removed and a silicide film 9 can be easily formed on the P+ diffusion layer 24P by forming the N-type semiconductor region 21 on which the P+ diffusion layers 24P are formed in the Ge high-concentration region 3'.

Thus, the methods explained in the first and second embodiments can be applied not only to the gate electrodes but also to semiconductor activation layers, for example, diffusion layers functioning as source/drain regions.

Fourth Embodiment

FIG. 30A is a plan view showing the semiconductor device according to the fourth embodiment of the present invention and FIG. 30B is a cross sectional view taken along the 30B—30B line of FIG. 30A.

In the third embodiment, the fact that the methods explained in the first and second embodiments can be applied to semi-conductor activation layers, for example, diffusion layers functioning as source/drain regions was explained.

As shown in FIGS. 30A, 30B, in the fourth embodiment, a P+ diffusion layer 29P is formed on a P-type semiconductor region 20. The P+ diffusion layer 29P functions as a contact which is used to apply the same potential as the source potential of a transistor to the P-type semiconductor region 20 functioning as a back-gate of the transistor.

A substrate 19 in the present embodiment is an SiGe substrate containing silicon and germanium. Like the third embodiment, a Ge low-concentration region 2' containing germanium of low concentration and a Ge high-concentration region 3' containing germanium of high concentration are formed in the SiGe substrate. The P+ diffusion layer 29P is formed in the Ge high-concentration region 3'. Further, the P+ diffusion layer 29P is formed in contact with the N+ diffusion layer 24N via an impurity mixture region 7'. The impurity mixture region 7' is formed in the Ge high-concentration region 3'. A silicide film 9 is continuously formed on the N+ diffusion layer 24N, impurity mixture region 7' and P+ diffusion layer 29P. Further, the silicide film 9 is not divided on the P+ diffusion layer 4.

(Modification of the Method for Forming the Ge High-concentration Region)

Next, a modification of the Ge high-concentration region forming method is explained.

In the first and second embodiments, when the Ge high-concentration region 3 is formed, a selected portion of the semiconductor film 1 is oxidized and then the Ge high-concentration region 3 is formed by utilizing the phenomenon that Ge is difficult to be introduced into the oxide film. However, the Ge high-concentration region 3 can be formed by use of a method other than the above forming method.

(First Modification)

Figure 31A:
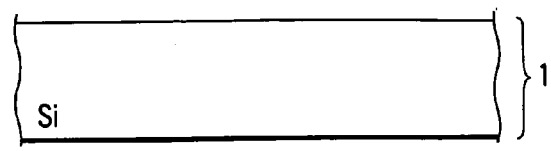
FIGS. 31A, 31B and 31C are cross sectional views showing a first modification of a forming method of a Ge high-concentration region.
Figure 31B:
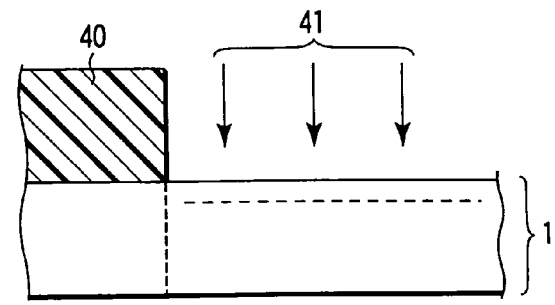
Figure 31C:
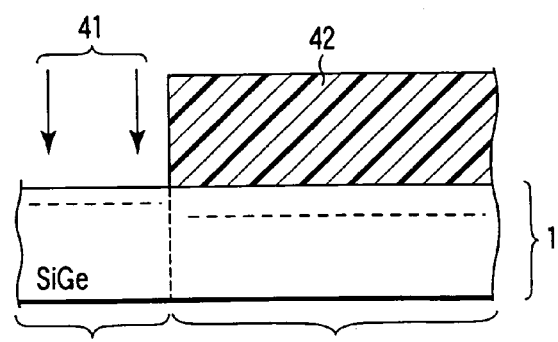

FIGS. 31A, 31B and 31C are cross sectional views showing a first modification of the forming method of the Ge high-concentration region.

First, as shown in FIG. 31B, a resist mask 40 is formed on a semiconductor film 1 containing silicon as shown in FIG. 31A. Then, germanium ions 41 are implanted into the semiconductor film 1 with the resist mask 40 used as a mask.

Next, as shown in FIG. 31C, for example, a resist mask 42 is formed on a portion of the semiconductor film 1 into which germanium is implanted. Then, germanium ions 41 which are smaller in dose amount than in a case of the step shown in FIG. 31B are implanted into the semiconductor film 1 with the resist mask 42 used as a mask.

Thus, by implanting germanium ions into the semiconductor film 1 after changing the dose amount thereof, the Ge low-concentration region 2 and Ge high-concentration region 3 can be formed in the semiconductor film 1.

(Second Modification)

Figure 32A:
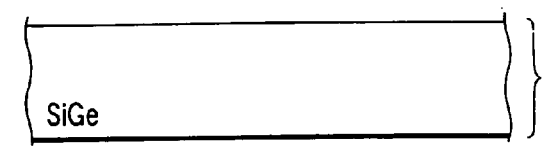
FIGS. 32A and 32B are cross sectional views showing a second modification of the forming method of a Ge high-concentration region.
Figure 32B:
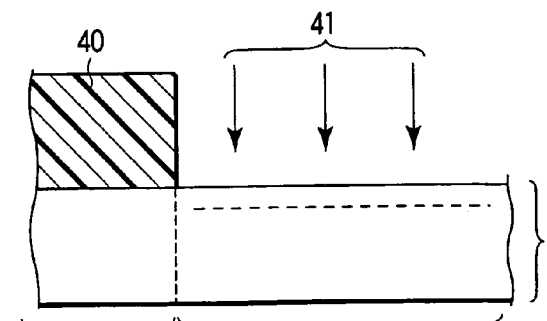
Figure 33A:
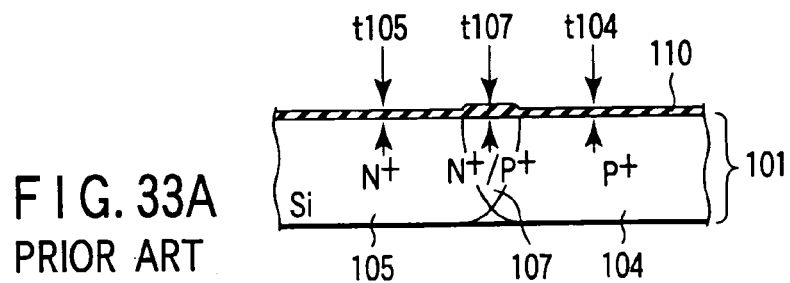
FIGS. 33A, 33B, 33C, 33D and 33E are cross sectional views showing a manufacturing method of the conventional semiconductor device in the order of the manufacturing steps.
Figure 33B:
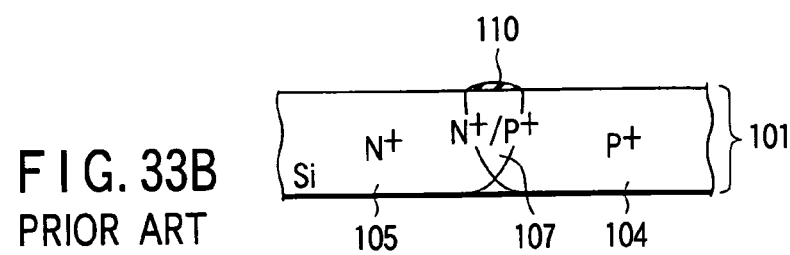
Figure 33C:
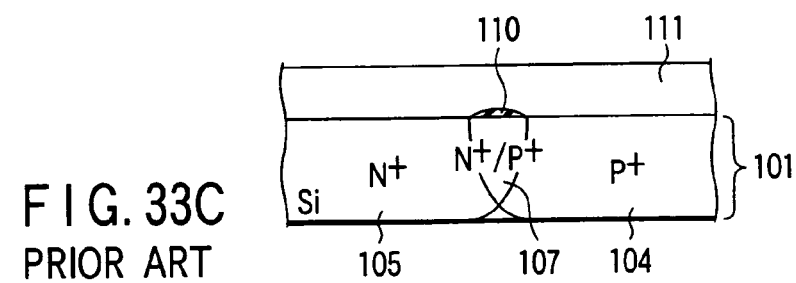
Figure 33D:
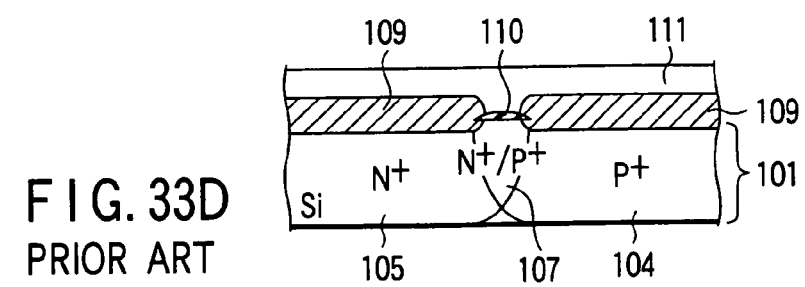
Figure 33E:
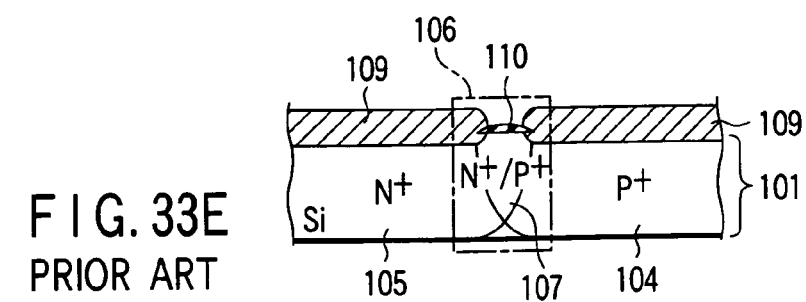
Figure 34A:
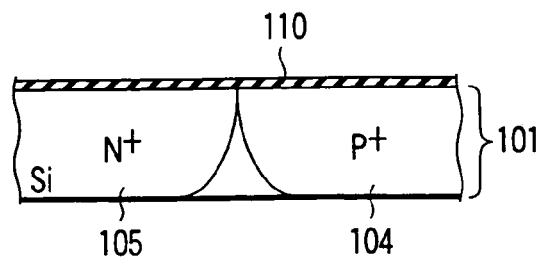
FIGS. 34A, 34B, 34C, 34D and 34E are cross sectional views showing a manufacturing method of the conventional semiconductor device in the order of the manufacturing steps.
Figure 34B:
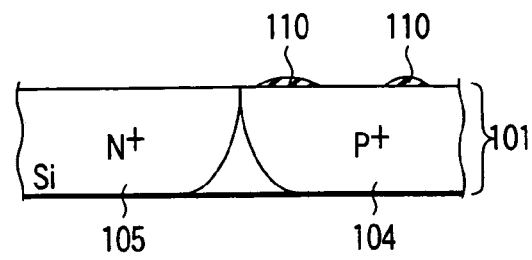
Figure 34C:
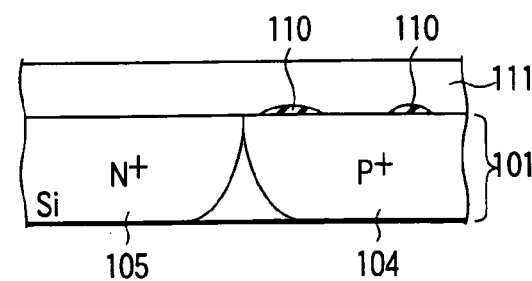
Figure 34D:
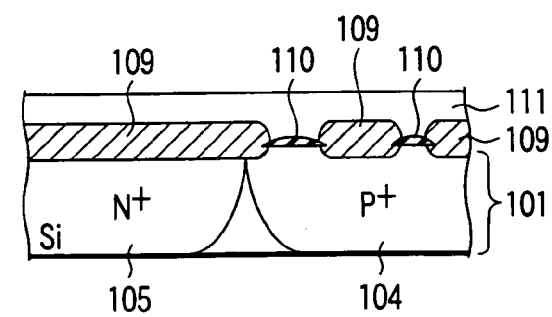
Figure 34E:
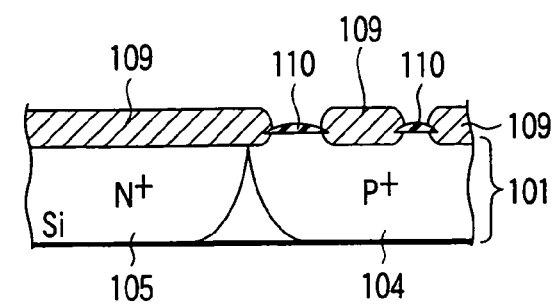
Figure 35:
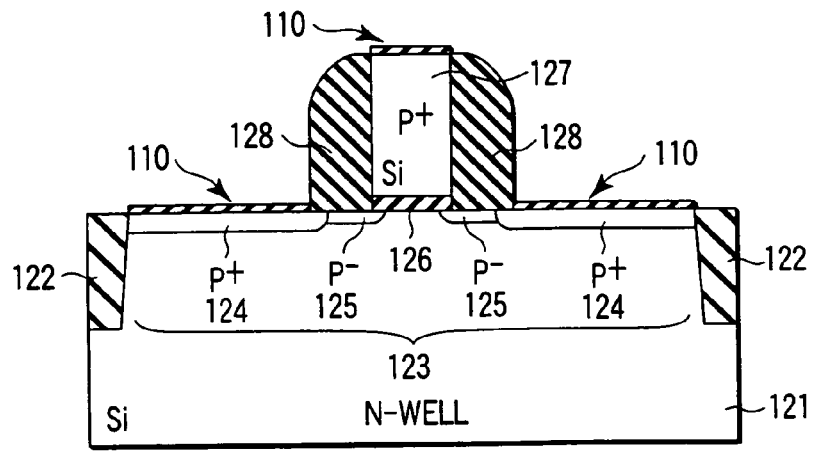
FIG. 35 is a cross sectional view showing one manufacturing step of the conventional semiconductor device.
Figure 36:
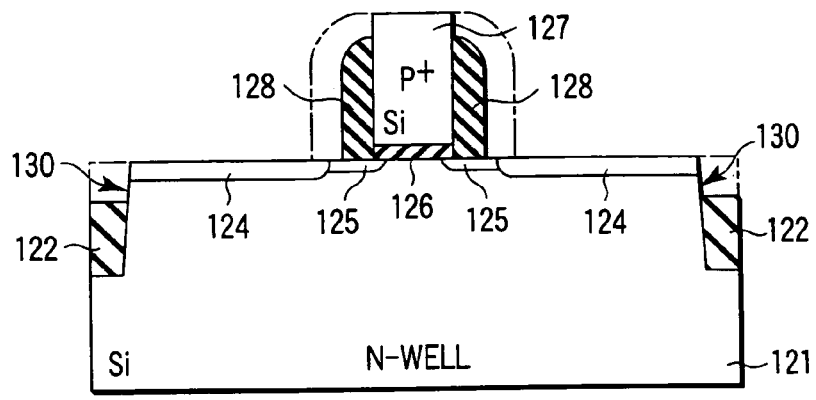
FIG. 36 is a cross sectional view showing one manufacturing step of the conventional semiconductor device.
Figure 37:
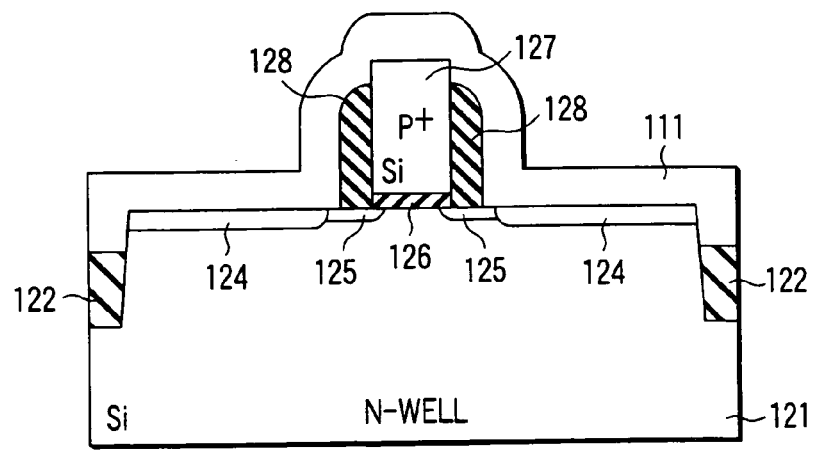
FIG. 37 is a cross sectional view showing one manufacturing step of the conventional semiconductor device.
Figure 38:
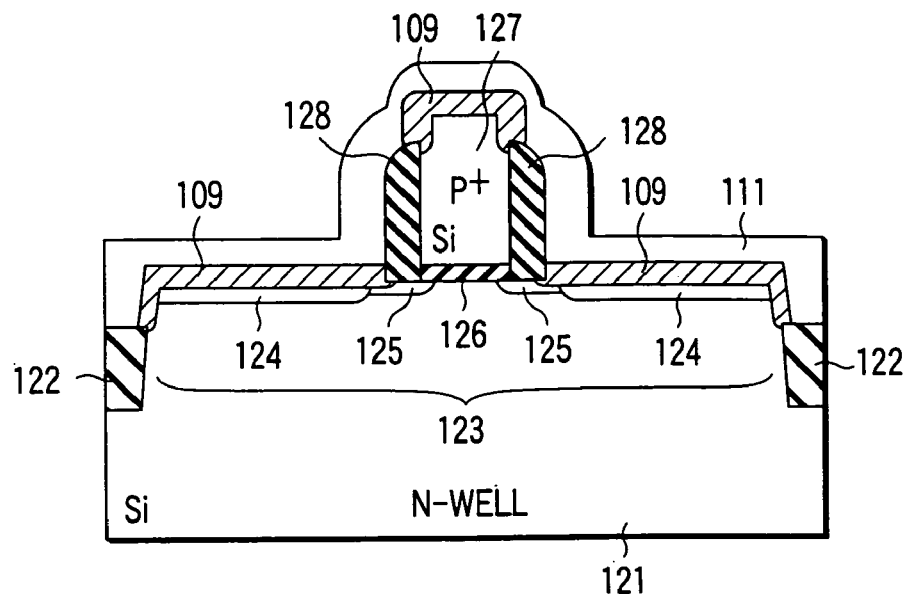
FIG. 38 is a cross sectional view showing one manufacturing step of the conventional semiconductor device.
Figure 39:
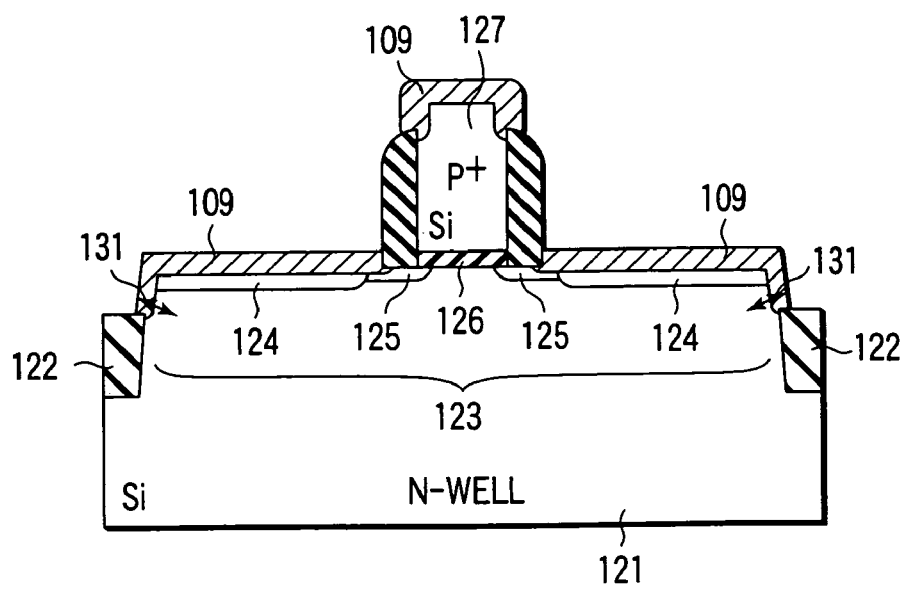
FIG. 39 is a cross sectional view showing one manufacturing step of the conventional semiconductor device.

FIGS. 32A and 32B are cross sectional views showing a second modification of the Ge high-concentration region forming method.

First, as shown in FIG. 32B, a resist mask 40 is formed on a semiconductor film 1 containing silicon as shown in FIG. 32A. Then, germanium ions 41 are implanted into the semiconductor film 1 with the resist mask 40 used as a mask.

Thus, additionally implanting germanium ions into the semiconductor film 1, the Ge low-concentration region 2 and Ge high-concentration region 3 can be formed in the semiconductor film 1.

As described above, the present invention has been explained by use of the first to fourth embodiments, but the present invention is not limited to the first to fourth embodiments and can be variously modified without departing from the technical scope thereof.

For example, in the first to fourth embodiments, the insulated gate field effect transistor is shown as an example, but the present invention is not applied only to the insulated gate field effect transistor. The present invention can also be applied to an active element other than the insulated gate field effect transistor, for example, a bipolar transistor or the like if it is a semiconductor device having a silicide film. Further, the present invention can be applied not only to an active element but also to a passive element such as a capacitor, or diode if it has a silicide film.

In addition, the above embodiments can be independently performed, but it is of course possible to adequately combine and demonstrate the embodiments.

Further, inventions of various stages are contained in the above embodiments and can be extracted by adequately combining a plurality of constituent elements disclosed in the respective embodiments.

As described above, according to the first to fourth embodiments of the present invention, a semiconductor device in which a silicide film can be easily formed and a manufacturing method thereof can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    implanting germanium ions into a selected portion of a semiconductor region containing at least silicon;
    forming P-type and N-type diffusion layers in the semiconductor region with a boundary region between the above diffusion layers being set in the selected portion; and
    forming a silicide film which extends from the N-type diffusion layer over to the boundary region and the P-type diffusion layer.

2. The method according to claim 1, wherein the P-type diffusion layer is formed in the selected portion.

3. The method according to claim 1, wherein a natural oxide film is removed before the silicide film is formed.

4. The method according to claim 3, wherein an etchant containing hydrofluoric acid is used to remove the natural oxide film.

5. A method of manufacturing a semiconductor device comprising:
    implanting first germanium ions into a first selected portion of a semiconductor region containing at least silicon;
    implanting second germanium ions into a second selected portion of the semiconductor region, the dose amount of the second germanium ions being smaller than the dose amount of the first germanium ions;

forming P-type and N-type diffusion layers in the semiconductor region with a boundary region between the above diffusion layers being set in the first selected portion; and forming a silicide film which extends from the N-type diffusion layer over to the boundary region and the P-type diffusion layer.

6. The method according to claim 5, wherein the P-type diffusion layer is formed in the first selected portion.

7. The method according to claim 5, wherein a natural oxide film is removed before the silicide film is formed.

8. The method according to claim 7, wherein an etchant containing hydrofluoric acid is used to remove the natural oxide film.

9. A method of manufacturing a semiconductor device comprising:

implanting germanium ions into a selected portion of a semiconductor region containing at least silicon and germanium;

forming P-type and N-type diffusion layers in the semiconductor region with a boundary region between the above diffusion layers being set in the selected portion; and forming a silicide film which extends from the N type diffusion layer over to the boundary region and the P-type diffusion layer.

10. The method according to claim 9, wherein the P-type diffusion layer is formed in the first selected portion.

11. The method according to claim 9, wherein a natural oxide film is removed before the silicide film is formed.

12. The method according to claim 11, wherein an etchant containing hydrofluoric acid is used to remove the natural oxide film.

* * * * *